(12) United States Patent
Suehiro et al.

(10) Patent No.: US 6,946,788 B2
(45) Date of Patent: Sep. 20, 2005

(54) LIGHT-EMITTING ELEMENT

(75) Inventors: Yoshinobu Suehiro, Nishikasugai-gun (JP); Masayoshi Koike, Nishikasugai-gun (JP); Hideaki Kato, Nishikasugai-gun (JP)

(73) Assignee: Toyoda Gosei Co., Ltd., Nishikasugai-gun (JP)

( * ) Notice: Subject to any disclaimer, the term of this patent is extended or adjusted under 35 U.S.C. 154(b) by 257 days.

(21) Appl. No.: 10/156,502

(22) Filed: May 29, 2002

(65) Prior Publication Data

US 2003/0122478 A1 Jul. 3, 2003

(30) Foreign Application Priority Data

| May 29, 2001 | (JP) | 2001-159991 |
| Jul. 6, 2001 | (JP) | 2001-206357 |
| Sep. 28, 2001 | (JP) | 2001-304033 |

(51) Int. Cl.$^7$ ................................................ H01J 1/62
(52) U.S. Cl. ................ 313/498; 313/506; 313/509; 313/112; 313/113
(58) Field of Search ................ 313/461, 466, 313/473, 474, 112, 113, 506, 509, 498

(56) References Cited

U.S. PATENT DOCUMENTS

| 3,813,589 A | | 5/1974 | Umeda et al. |
| 4,094,752 A | | 6/1978 | Vahe |
| 4,703,219 A | | 10/1987 | Mesquida |
| 5,187,547 A | | 2/1993 | Niina et al. |
| 5,779,924 A | | 7/1998 | Krames et al. |
| 5,798,610 A | * | 8/1998 | Koenck et al. ............. 313/498 |
| 6,142,643 A | * | 11/2000 | Araki et al. ............. 313/498 |
| 6,333,522 B1 | | 12/2001 | Inoue et al. |
| 2001/0033135 A1 | * | 10/2001 | Duggal et al. ............. 313/506 |

FOREIGN PATENT DOCUMENTS

| DE | 24 16 098 | 10/1975 |
| DE | 41 30 878 A1 | 3/1993 |
| DE | 42 18 806 A1 | 12/1993 |
| EP | 1 158 585 A1 | 11/2001 |
| JP | 56-050586 | 5/1981 |
| JP | 58-040872 | 3/1983 |
| JP | 59-067673 | 4/1984 |
| JP | 61-110476 | 5/1986 |
| JP | 63-086580 | 4/1988 |
| JP | 1-137679 | 5/1989 |
| JP | 5-167101 | 7/1993 |
| JP | 2000-196152 | 7/2000 |
| WO | WO 00/39860 | 7/2000 |
| WO | WO 01/41225 A2 | 6/2001 |
| WO | WO 01/47039 | 6/2001 |
| WO | WO 01/80322 A2 | 10/2001 |
| WO | WO 02/13281 A1 | 2/2002 |
| WO | WO 02/37578 A1 | 5/2002 |
| WO | WO 02/41410 A1 | 5/2002 |
| WO | WO 02/073705 A2 | 9/2002 |

OTHER PUBLICATIONS

European Search Report dated Sep. 9, 2004.

* cited by examiner

*Primary Examiner*—Vip Patel
(74) *Attorney, Agent, or Firm*—McGinn & Gibb, PLLC

(57) ABSTRACT

A light-emitting element has a light-emitting layer and at lease one light-extracting portion. At least a partial part of the light-extracting portion is formed into a concave or convex surface for enhancing the efficiency of extracting light. Another light-emitting element has a light-emitting layer and a concave or convex surface for reflecting light emitted from the light-emitting layer toward one or more other surfaces of the light-emitting element through an inside of the light-emitting element.

29 Claims, 20 Drawing Sheets

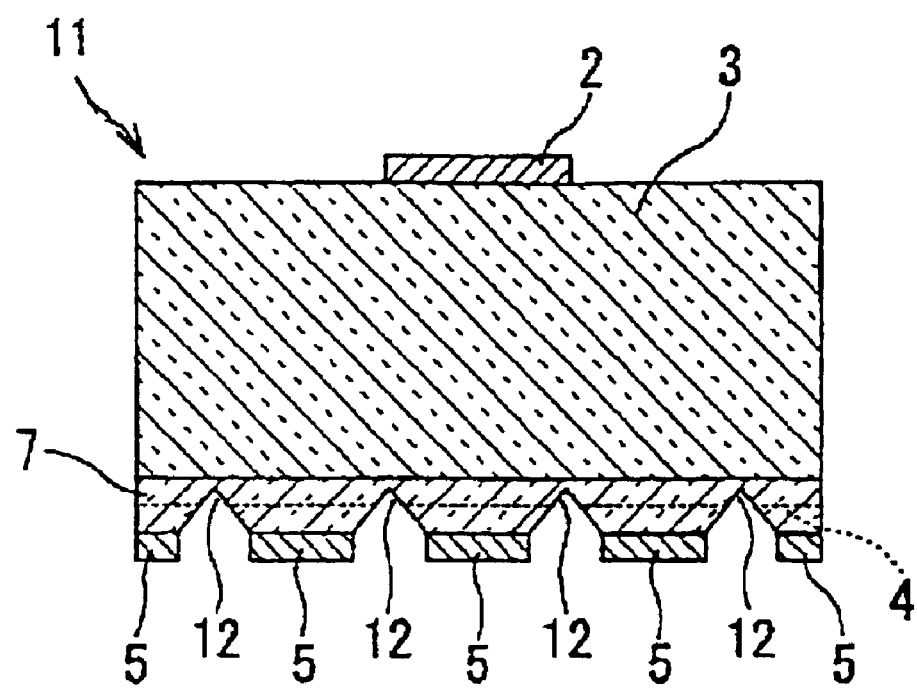

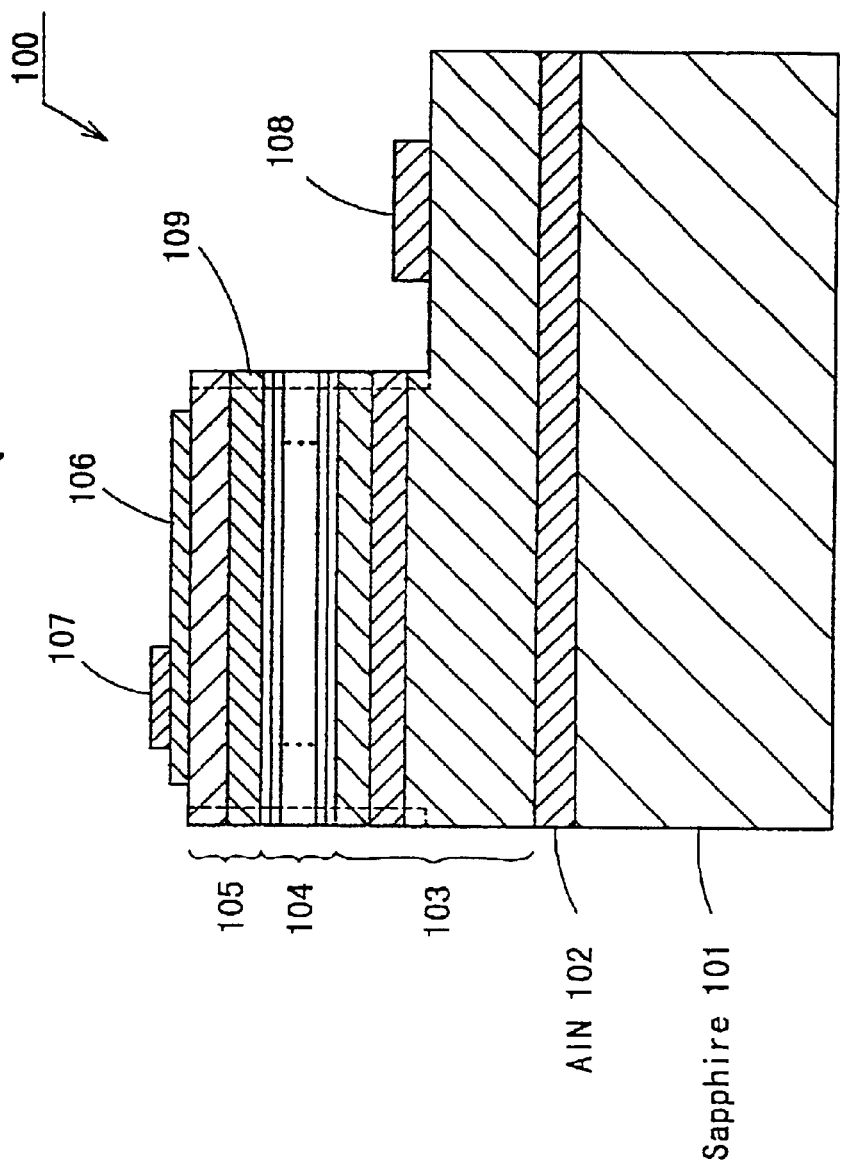

LIGHT-EMITTING ELEMENT

The present application is based on Japanese Patent Applications No. 2001-159991, 2001-206357 and 2001-304033, which are incorporated herein by reference.

BACKGROUND OF THE INVENTION

1. Field of the Invention

The present invention relates to an LED chip (hereinafter referred to as "light-emitting element") in which a light-emitting layer is formed on a substrate, and light is emitted from the light-emitting layer in response to a voltage applied thereto.

2. Description of the Related Art

In a light-emitting element, for example, a GaAs-based crystal layer or the like is epitaxially grown on a GaAs crystal substrate or the like so that a light-emitting layer is formed. When electrodes of an anode and a cathode are provided and a voltage is applied therebetween, light is emitted from the light-emitting layer, and the light is radiated from the top surface (light-emitting surface).

However, in a light-emitting element, a crystal layer including a light-emitting layer is generally high in refractive index, and also high in absorptance of emitted light. Thus, there has been a problem that the efficiency of extracting light from the light-emitting element is low. That is, of light emitted from a light-emitting layer, only light incident on a top surface (light-emitting surface) within a critical angle is radiated externally with high efficiency. However, the refractive index of the light-emitting layer is so high that the critical angle is very small. As a result, only a part of the light is radiated externally while the rest light is absorbed in the crystal layer which is high in absorptance. Thus, most of the light is converted into heat.

SUMMARY OF THE INVENTION

It is an object of the invention to provide a light-emitting element in which, of light emitted from a light-emitting layer, propagated light large in horizontal component with respect to the light-emitting layer is reflected to be incident on the top surface within a critical angle, so that the efficiency of extracting light from the crystal can be increased to improve the light output.

It is another object of the invention to provide a light-emitting element in which a crystal layer is formed on a substrate having a refractive index near to the refractive index of the crystal layer, so that the efficiency of extracting light from a light-emitting layer is high, the heat generation rate is low, and further, the property of radiating the heat generated in the light-emitting element is excellent.

It is still another object of the invention to provide a light-emitting element in which the area of the crystal interface is increased without changing the optical density in the crystal, that is, without changing the element size. Thus, the external radiation area for emitted light existing at random in terms of the position and direction in the crystal is increased so that the light-extracting efficiency, that is, the external quantum efficiency is increased.

Incidentally, the objects are objects to be attained separately and individually, and should not be interpreted as objects attained collectively and simultaneously.

(1) According to the invention, there is provided a light-emitting element, wherein reflecting grooves and/or reflecting holes are formed in the bottom surface of the light-emitting element, and light emitted from a light-emitting layer is reflected upward by the reflecting grooves and/or the reflecting holes.

The distance with which light radiated obliquely laterally from each light-emitting point in the light-emitting layer travels to the crystal interface is so long that the light is absorbed in a crystal layer high in absorptance and converted into heat. In addition, the solid angle is so large laterally that the quantity of light radiated within such a range is large. The reflecting grooves and/or the reflecting holes for reflecting the light upward are formed in the bottom surface of the light-emitting element. Thus, by use of the reflecting grooves and/or the reflecting holes formed thus, the light which was not allowed to be radiated externally in the related art can be radiated externally so that the light-extracting efficiency can be increased.

In such a manner, the light-emitting element is designed so that, of light emitted from the light-emitting layer, propagated light having a large horizontal component with respect to the light-emitting layer is reflected to be incident on the top surface within the critical angle so that the efficiency of extracting light from the crystal can be increased. Thus, the light output can be improved.

(2) According to the invention, in the light-emitting element having the configuration defined in (1), the light-emitting layer is formed on the bottom surface side.

Accordingly, there is little vertical difference between the light-emitting layer and the bottom surface. Thus, light radiated substantially horizontally from each light-emitting point in the light-emitting layer can be also reflected upward by the reflecting grooves and/or the reflecting holes formed in the bottom surface, so as to be radiated externally. As a result, most of the light radiated laterally in a large light quantity can be radiated externally. In addition, the light-emitting layer is provided closely to an electrode in the bottom surface. Accordingly, the heat of the light-emitting layer can be released through the electrode in the bottom surface. Thus, the property of heat radiation is improved so that the light-emitting efficiency also increases.

In such a manner, the light-emitting element is designed so that light radiated laterally toward the bottom surface is also reflected upward. Thus, the light-extracting efficiency can be further increased. In addition, the property of heat radiation is improved so that the light-emitting efficiency is also increased. As a result, the light output can be further improved.

(3) According to the invention, in the light-emitting element having the configuration defined in (1) or (2), electrodes opposite in polarity are formed on the bottom surface side.

Accordingly, it is not necessary to form any electrode on the top surface. Therefore, even if the light-emitting element is formed into a small chip, it is possible to maintain the effect to reflect light upward by the reflecting grooves or the reflecting holes formed in the bottom surface according to the invention to thereby improve the external radiation efficiency. Then, when the light-emitting element is formed into a small chip, the course in which light is reflected several times in the crystal layer of the light-emitting element and then radiated externally becomes short enough to reduce the ratio of light absorbed in the crystal layer which is high in light absorptance. Thus, the external radiation efficiency is further improved.

In such a manner, because it is not necessary to form any electrode on the top surface, the light-emitting element can be designed to be a small chip, so that the light-extracting efficiency can be further improved.

(4) According to the invention, in the light-emitting element having the configuration defined in any one of (1) to (3), maximum heights of the reflecting grooves and/or the reflecting holes reach in an internal portion of the light-emitting layer.

In the light-emitting element having such a configuration, not only light radiated horizontally from each light-emitting point in the light-emitting layer but also light radiated somewhat obliquely upward can be reflected upward by the reflecting grooves or the reflecting holes which are formed to have heights reaching in the internal portion of the light-emitting layer. Thus, almost the whole part of the light radiated laterally in a large light quantity can be radiated externally.

In such a manner, the light-emitting element is designed so that almost the whole part of the light radiated laterally from each light-emitting point in the light-emitting layer can be reflected upward. Thus, the light-extracting efficiency is further increased so that the light output can be further improved.

(5) According to the invention, in the light-emitting element having the configuration defined in any one of (1) to (3), the light-emitting area of the light-emitting layer is formed as split light-emitting areas formed in places other than the places where the reflecting grooves and/or said reflecting holes are formed.

In the light-emitting element having such a configuration, since the reflecting grooves or the reflecting holes are not formed in the light-emitting layer, influence of the formed reflecting grooves or the formed reflecting holes on the light-emitting layer can be reduced so that the light-emitting element can be applied to a light-emitting layer which is weak physically. Then, when the reflecting grooves or the reflecting holes are formed to reach a height above the light-emitting area of the light-emitting layer, not only light radiated horizontally from each light-emitting point in the light-emitting layer but also light radiated somewhat obliquely upward can be reflected upward by the reflecting grooves or the reflecting holes, in the same manner as in the case where the reflecting grooves or the reflecting holes are formed to have heights reaching in the internal portion of the light-emitting layer. Thus, almost the whole part of the light radiated laterally in a large light quantity can be radiated externally.

In such a manner, the light-emitting element is designed so that the light-emitting element can be applied to a light-emitting layer which is weak physically, while almost the whole part of the light radiated laterally from each light-emitting point in the light-emitting layer can be reflected upward. Thus, the light-extracting efficiency is further increased so that the light output can be further improved.

(6) According to the invention, in the light-emitting element having the configuration defined in any one of (1) to (5), a substrate lower in refractive index than the light-emitting layer is located above the light-emitting layer.

When the substrate having a low refractive index is located above the light-emitting layer having a high refractive index in such a manner, light radiated laterally from the light-emitting layer is confined in the crystal layer having a high refractive index. Thus, of the light radiated laterally, light having an upward component is also reflected upward by the reflecting grooves formed in the bottom surface. As a result, the ratio of light reflected upward increases so that the external radiation efficiency is further improved. In addition, the critical angle increases at each interface in comparison with the case where light is radiated directly into the air from the light-emitting layer having a high refractive index. Thus, it becomes easy to extract the light.

In such a manner, the light-emitting element is designed so that the light confined in the crystal layer having a high refractive index is reflected upward while the critical angle increases at each interface so that it becomes easy to extract light. As a result, the light-extracting efficiency is further increased so that the light output can be improved.

(7) According to the invention, there is provided a light-emitting element including a light-emitting layer and at lease one light-extracting portion, wherein the light-extracting portion is shaped to be substantially convex, and substantially equal refractivity is kept between the light-emitting layer and the light-extracting portion.

Since substantially equal refractivity is kept between the light-emitting layer and the light-extracting portion thus, there is no fear that refraction or interfacial reflection occurs between the light-emitting layer and the light-extracting portion. Further, since the light-extracting portion is shaped to be substantially convex, each of the light-extracting surfaces constituting the light-extracting portion becomes nearly perpendicular to the light emitted from the light-emitting layer so that a ratio of the light incident within the critical angle at which the light is allowed to be radiated externally becomes large. Accordingly, the influence of interfacial reflection at the interface of the light-extracting portion is reduced greatly so that the light emitted from the light-emitting layer is effectively radiated externally from the light-extracting portion. Thus, the light-emitting element is designed to be large in the efficiency of extracting the light from the light-emitting layer.

(8) According to the invention, in the light-emitting element having the configuration defined in (7), the light-emitting element is mounted so that the light-emitting layer is located on a bottom surface side of the light-emitting element.

The light-emitting element is mounted so that the light-emitting layer comes to the bottom surface side of the light-emitting element. In such an-configuration, of the light emitted upward from each light-emitting point of the light-emitting layer, only the light radiated within the critical angle with respect to the interface between the crystal layer and the substrate is allowed to pass through the interface to enter the substrate, so that the light which has passed through the interface is directly radiated externally with good efficiency. Here, since the substantially equal refractivity is kept between the light-emitting layer and the light-extracting portion, the crystal layer and the substrate are substantially equal in refractive index. Accordingly, almost the whole part of the light passes through the interface between the crystal layer and the substrate without having any refraction or interfacial reflection generated at the interface so that the light is efficiently radiated externally from the substrate. When the light-extracting efficiency is improved in such a manner, the external quantum efficiency is enhanced. Further, although the light-emitting element is mounted on metal having high heat conductivity, the property of radiating the heat generated in the light-emitting layer is improved because the light-emitting layer is located on the bottom surface side of the light-emitting element. Further, with the enhancement of the external quantum efficiency, the rate of heat generation is reduced, so that the input allowable electric power increases in addition to the improvement of the heat radiation property. Accordingly, higher output can be achieved in combination with the achievement of higher efficiency.

When the light-emitting element is mounted so that the light-emitting layer is located on the bottom surface side of the light-emitting element thus, it is possible to obtain a light-emitting element in which the efficiency of extracting light from the light-emitting layer is high, the heat radiation property is improved, the heat generation rate is low, and higher output can be attained.

(9) According to the invention, in the light-emitting element having the configuration defined in (7) or (8), electrodes opposite in polarity are formed on the bottom surface side.

Thus, the formation of the light-extracting portion can be made easily. Further, it is not necessary to form any electrode on the substrate side, that is, on the light-emitting surface side, so that the light which has passed through the substrate can be efficiently radiated externally without being blocked by the electrode.

Thus, it is possible to obtain a light-emitting element in which the efficiency of extracting light from the light-emitting layer is high, the heat generation rate is low, and, further, the property of radiating the heat generated in the light-emitting element is high.

(10) According to the invention, in the light-emitting element having the configuration defined in any one of (7) to (9), the substantially convex light-extracting portion is constituted by at least five light-extracting surfaces, and the light-emitting layer exists in a direction substantially perpendicular to each light-extracting surface.

In the light-emitting element having such a configuration, the substantially convex light-extracting portion is constituted by at least five light-extracting surfaces, and the light-emitting layer exists in a direction substantially perpendicular to each light-extracting surface. Accordingly, almost the whole part of the light emitted from the light-emitting layer is radiated externally from the light-extracting surfaces, so that the external quantum efficiency is made high.

Thus, it is possible to obtain a light-emitting element in which the efficiency of extracting light from the light-emitting layer is very large.

(11) According to the invention, in the light-emitting element having the configuration defined in any one of (7) to (10), the substantially convex light-extracting portion includes a curved light-extracting surface, and the light-emitting layer exists in a direction substantially perpendicular to the light-extracting surface.

Thus, the incidence angle of the light emitted from the light-emitting layer and made incident onto the curved light-extracting surface becomes deeper compared with the flat light-extracting surface so that the incidence angle is close to an angle with perpendicular incidence. Accordingly, the external radiation efficiency of the primary light further increases and the light-extracting efficiency can be made high.

(12) According to the invention, in the light-emitting element having the configuration defined in any one of (7) to (11), the light-emitting layer is a part of a crystal layer and located in a vicinity of a central portion of the substantially convex light-extracting portion.

In such a configuration, the light-emitting layer for the light-extracting portion approximates a point light source and is located in the vicinity of the central portion of the light-extracting portion, in comparison with the case where a light-emitting layer is formed over a substantially whole surface of a crystal layer. Accordingly, the incidence angle of the light emitted from the light-emitting layer and made incident onto the light-extracting portion generally becomes a deep angle, so that the external radiation efficiency of the primary light further increases and the light-extracting efficiency can be made high. Accordingly, in the case where the chip size of the light-emitting element according to the invention is substantially the same as that of a light-emitting element having a light-emitting layer formed over the substantially whole surface of a crystal layer, the light-emitting element according to the invention can be made to be an energy-saving element in which the same emission output can be obtained with less electric power than that used in the related-art element because of improvement in the efficiency of externally extracting the light emitted from the light-emitting layer. Further, if the chip size of the light-emitting element is made large to have a light-emitting area of the light-emitting layer substantially the same in size as a light-emitting element in which a light-emitting layer is formed over the substantially whole surface of a crystal layer, it is possible to obtain larger output using the same electric power as the related-art element. Further, it is possible to reduce the heat generation and improve the heat radiation property so that a larger electric power than the related-art element can be inputted to attain larger output.

At present, energy saving and high efficiency is often requested of the LED light source for serving as the light source for a mobile apparatus, and high output is often requested of the LED light source for serving as the light source substituted for the incandescent lamp. According to the configuration of the light-emitting element of the invention, both the requests can be met as described above.

(13) According to the invention, in the light-emitting element having the configuration defined in any one of (7) to (12), the light-emitting element includes a plurality of the substantially convex light-extracting portions.

Thus, the ratio of the light emitted from the light-emitting layer and made incident within the critical angle can be made high so that the external radiation efficiency of the primary light can be increased. Further, the light-extracting area can be enlarged so that the external radiation efficiency of the secondary light and other lights derivatively generated after that also becomes high and the light-extracting efficiency becomes high. As a result, even in the case where the thickness of the substrate is thin relative to the whole size of the light-emitting element, it is possible to obtain an effect of enhancing the light-extracting efficiency in the same manner. Accordingly, reduction in the light-extracting efficiency can be prevented when the chip size of the light-emitting element is made large. Further, the yield of the light-emitting elements from a base material can be improved. That is, when the chip size of the light-emitting element is to be made large in a similar shape to that of a light-emitting element having one substantially convex light-extracting portion, it is necessary to increase the thickness of the wafer and the yield of the light-emitting elements from the material is reduced. When a plurality of the substantially convex light-extracting portions are provided in the light-emitting element, it is possible to expect the same efficiency as that obtained by a light-emitting element in which the thickness of a wafer is not changed and a dicing size is made large, and a high yield of the light-emitting elements from a material can be obtained for effective utilization.

Thus, even when the thickness of the substrate is thin relative to the whole size of the light-emitting element, it is possible to provide a light-emitting element in which the effect of increasing the light-extracting efficiency can be obtained in the same manner, a high yield of the light-emitting elements from the material can be obtained for effective utilization, and reduction in the light-extracting efficiency can be prevented when the chip size is made large.

(14) According to the invention, in the light-emitting element having the configuration defined in (13), the substantially convex light-extracting portions are arranged in a lattice structure.

Thus, even in the case where the height of the substrate is low relative to the width of the light-emitting element, the light emitted from the light-emitting layer in the crystal layer is extracted efficiently from the substantially convex light-extracting portions arranged in a lattice structure so that high external radiation efficiency can be obtained. Therefore, the same light-extracting efficiency can be expected even when the chip of the light-emitting element is made large, and the yield of the light-emitting elements from the base material can be improved. That is, when the chip size of the light-emitting element is to be made large in a similar shape to that of a light-emitting element having one substantially convex light-extracting portion, it is necessary to increase the thickness of the wafer and the yield of the light-emitting elements from the material is reduced. If a plurality of the substantially convex light-extracting portions are arranged in a lattice structure, it is possible to expect the same efficiency as that obtained by a light-emitting element in which the thickness of a wafer is not changed and a dicing size is made large, and a high yield of the light-emitting elements from a material can be obtained for effective utilization.

(15) According to the invention, in the light-emitting element having the configuration defined in any one of (7) to (14), the light-emitting layer is formed only in a portion of the crystal layer of the light-emitting element, the portion of the crystal layer being substantially perpendicular to the at least one light-extracting portion.

Thus, the light-emitting layer is formed only at a central portion of each divided portion of the crystal layer to make the light-emitting layer as a point light source. In the case where the chip size is made to be substantially the same as that of a light-emitting element in which the light-emitting layer is formed over the whole surface of the crystal layer, the external radiation efficiency of the primary light of the light emitted from the light-emitting layer further increases so that the light-extracting efficiency is improved. Further, due to reduction in the internal heat generation, not only is the light-extracting efficiency increased but also the output reduction caused by the heat generation can be suppressed, so that further improvement in the efficiency can be attained. Further, when the chip size is made large so that the light-emitting area of the light-emitting layer formed at only the central portions is formed to have the same size as the light-emitting area of a light-emitting layer formed over the whole of the crystal layer, the conduction current can be set large so that the output can be made larger. At present, energy saving and high efficiency is often requested of the LED light source for serving as the light source for a mobile apparatus, and high output is often requested of the LED light source for serving as the light source substituted for the incandescent lamp. According to the configuration of the light-emitting element of the invention, both the requests can be met.

Thus, the light-emitting layer is formed as a point light source, so that it is possible to provide a light-emitting element in which the efficiency is further improved and the higher output can be obtained.

(16) According to the invention, in the light-emitting element having the configuration defined in any one of (7) to (15), the light-extracting portion is constituted by surfaces including a curved surface.

Thus, in comparison with the case where the light-extracting surfaces are constituted by only flat surfaces, the incident angle of the light emitted from the light-emitting layer and incident onto the light-extracting surface becomes deeper, so that the external radiation efficiency of the primary light further increases and the light-extracting efficiency can be made high.

(17) According to the invention, in the light-emitting element having the configuration defined in (14), the curved surface includes a cylindrical surface.

Thus, when a light-extracting surface is made to be a cylindrical surface with a central portion of the light-emitting layer as an origin, the light emitted from the light-emitting layer is incident substantially perpendicularly to the light-extracting surface so that the external radiation efficiency of the primary light further increases. If all the light-extracting surfaces are made to be cylindrical surfaces with the central portion of the light-emitting layer as the origin and the cylindrical surfaces are combined, almost the whole part of the light emitted from the light-emitting layer is substantially perpendicularly incident to the light-extracting surfaces, and the external radiation efficiency of the primary light remarkably increases. Accordingly, the light-extracting efficiency can be enhanced greatly.

(18) A light-emitting element according to the invention has a feature in that the light-emitting element is a solid state light-emitting element having a lamellar light-emitting area, and at least the circumference of the side surface of the light-emitting area is wholly or partially formed into a concavo-convex side surface having a concavo-convex shape.

Here, the lamellar light-emitting area may be made up of either a single layer or a plurality of layers. When a semiconductor is used, its conductivity type may be either a p-type or an n-type. When the light-emitting area is made up of a plurality of layers, the light-emitting area may be made up of a plurality of layers of semiconductors having the same composition ratio but with different concentrations of additive impurities, or a plurality of layers of semiconductors different in the composition ratio, different in constituent components, or different in concentrations of impurities added to these plurality of layers. The light-emitting area maybe non-doped, of an n-type or of a p-type. Layers having various functions may be placed above or under the light-emitting area. Examples of such layers include n-layers, p-layers and non-impurity layers. When a semiconductor light-emitting element is formed, a pn homojunction structure, a single heterojunction structure, a double heterojunction structure, or the like, can be adopted. As the light-emitting area, a single quantum well structure, a multiple quantum well structure, or the like, can be adopted.

The invention is applicable to intrinsic EL as well as injection type LEDs.

It will go well if at least the side surface of the light-emitting area is formed to be concavo and convex (irregular). Concavities and convexities may be formed to reach the side surface which does not belong to the light-emitting area. In addition, concavities and convexities may be formed all over the circumference of the side surface or in a part of the circumference of the side surface. As the portion in which the concavities and convexities are formed is longer, the effect of extracting light becomes greater. When the concavities and convexities are formed in a part of the circumference, for example, they may be formed in at least one side or opposite sides of the four sides of the light-emitting element which is formed to be rectangular.

(19) In addition, the light-emitting element according to the invention (18) has a feature in that concavities and convexities of the concavo-convex side surface are of a curve with a change in curvature.

The horizontal section of the concavities and convexities is a curve. For example, a curved column forms the concavities and convexities. The curved column may be inclined.

(20) In addition, the light-emitting element according to the invention (18) or (19) has a feature in that the concavo-convex side surface has a taper angle with respect to the light-emitting area.

(21) In addition, the light-emitting element according to any one (18) to (20) has a feature in that the concavo-convex side surface is formed in an etching step.

(22) In addition, the light-emitting element according to anyone of (18) to (20) has a feature in that the concavo-convex side surface is formed in a step of patterning the light-emitting area.

(23) In addition, the light-emitting element according to anyone of (18) to (20) has a feature in that the concavo-convex side surface is formed in a step of separating the light-emitting element.

(24) In addition, the light-emitting element according to any one of (18) to (23) has a feature in that the light-emitting element is formed on a substrate whose refractive index is smaller than the refractive index of the lamellar light-emitting area.

A low-temperature growth buffer layer or a high-temperature growth buffer layer may be formed on the substrate. These buffer layers may be of multi-layers. Buffer layers and monocrystal layers may be repeated.

Either conductive material or insulating material can be used as the substrate. When conductive material is used, one of the electrodes can be formed on the back surface of the substrate. When insulating material is used, both the electrodes are formed on the top surface side of the substrate.

(25) In addition, the light-emitting element according to any one of (18) to (24) has a feature in that each layer of the light-emitting element formed on the substrate is made of a Group III nitride compound semiconductor.

(26) In addition, the light-emitting element according to any one of (18) to (23) has a feature in that the top surface of the light-emitting element is also formed into a concavo-convex shape.

The light-emitting element according to the invention (18) is a solid state light-emitting element having a lamellar light-emitting area, and at least the circumference of the side surface of the light-emitting area is wholly or partially formed into a concavo-convex side surface having a concavo-convex shape.

In a normal light-emitting element, light emitted in a light-emitting area is radiated omnidirectionally, and only light radiated in a substantially perpendicular direction is allowed to emerge from a substrate in the perpendicular direction. At this time, of light radiated from the light-emitting area and made incident on a layer located on the light-emitting area, for example, a p-layer (p-layer when the p-layer is located on the light-emitting area, and n-layer when the n-layer is located on the light-emitting area) if the light-emitting element is formed as a semiconductor light-emitting diode, light incident within a critical angle is allowed to emerge perpendicularly to the substrate directly.

However, since the p-layer (for example, a p-GaN layer) and the light-emitting area are higher in refractive index than the outside area, light whose incidence angle is larger than the critical angle is totally reflected by the p-layer so as to return to the light-emitting area again. That is, most of the light is confined in the light-emitting area and attenuated. That is, in such a related-art light-emitting element, all the light generated in the light-emitting area could not be allowed to emerge efficiently.

In the light-emitting element according to the invention, at least the circumference of the side surface of the light-emitting area is wholly or partially formed into a concavo-convex shape. When the side surface is formed into a concavo-convex shape, the normal line direction of the side surface can be varied into various directions. This variation in the normal line direction of the side surface leads to the variation of its critical angle concurrently. That is, light confined in the light-emitting area, particularly light confined laterally can be extracted more efficiently. That is, light which could not emerge in the related art can be allowed to emerge to the outside on a large scale. That is, the external quantum efficiency can be improved on a large scale. Incidentally, such concavities and convexities include concavities and convexities having any shape. Examples of the shapes include triangular ripples, and corrugations. In addition, the shape and size of the concavities and convexities may be random or periodic. The concavities and convexities include any kinds of them.

In addition, in the light-emitting element according to the invention (19), concavities and convexities of the concavo-convex side surface are of a curve with a change in curvature. That is, the concavities and convexities are constituted by curves having various curvature radii. Thus, the critical angle in the concavo-convex side surface is not fixed as that in a flat surface, but is varied so that the range of the incidence angle with which light is allowed to emerge to the outside is expanded as a whole. This is equivalent to expansion of the effective emergence area of light. In such a manner, light emitted from the light-emitting area is radiated externally with good efficiency. Thus, the light-emitting element is designed to be higher in external quantum efficiency.

In addition, in the light-emitting element according to the invention (20), the concavo-convex side surface of the light-emitting area has a taper angle with respect to the lamellar light-emitting area. When the normal line of the concavo-convex side surface has a taper angle with respect to the lamellar light-emitting area, that is, when the normal line of the side surface is not perpendicular to the normal line of the top surface of the layer of the light-emitting area, the area of the side surface can be increased. Accordingly, light reflected laterally internally can be extracted to the outside more efficiently. Further, for example, when the normal line of the side surface has a positive taper angle (angle of elevation) with respect to the lamellar light-emitting area, light emerging from the side surface has a component of angle of elevation with respect to the light-emitting area. Having the component of angle of elevation, the light emitted from the side surface is emitted to a portion above the layer effectively. Incidentally, the component of angle of elevation may be negative. When it is negative, the emergent light is once reflected by the substrate surface (on which the lamellar light-emitting area is formed), and then radiated in the positive direction again.

In addition, in the light-emitting element according to the invention (21), the concavo-convex side surface is formed in an etching step.

For example, when an insulating substrate is used to form an element structure in which an n-type layer is located on the bottom surface while anode and cathode electrodes are formed on the top surface side of the substrate, each layer has to be etched to be dug down to form an electrode for the n-type layer. At this time, for example, an concavo-convex pattern is made up out of resist or the like on the top surface in advance. When each layer is etched to be dug down with such a pattern formed, concavities and convexities in the etching pattern are formed in the side surface of the light-emitting area. That is, a concavo-convex side surface is formed. In addition, such a concavo-convex side surface can be formed easily because it is formed by etching.

In addition, in the light-emitting element according to the invention (22), the concavo-convex side surface is formed in a step of patterning the light-emitting area.

For example, if the concavities and convexities are formed in the step of patterning the light-emitting area on the basis of a metal organic vapor phase epitaxy method, the concavities and convexities can be shaped desirably. For example, the concavities and convexities can be formed into desired shapes such as corrugations, triangular ripples, or random shapes. In addition, the concavities and convexities can be designed strictly enough to prevent light emerging from any point in the side surface from being blocked by other protrusions of the side surface. Thus, the shape of the side surface can be optimized so that light can be radiated more efficiently.

In addition, in the light-emitting element according to the invention (23), the concavo-convex side surface is formed in a step of separating the light-emitting element. If the step of separating the light-emitting element is used, the side surface of the light-emitting area can be formed into a concavo-convex shape easily. Since a new step is not required, the manufacturing cost can be prevented from increasing, regardless of the light-emitting element.

In addition, in the light-emitting element according to the invention (24), the light-emitting element is formed on a substrate whose refractive index is smaller than the refractive index of the lamellar light-emitting area.

When the refractive index of the substrate is made smaller than the refractive index of the light-emitting area, total reflection becomes easier to occur on the substrate so that a part of light generated in the light-emitting area is propagated laterally in the light-emitting area. For example, when a GaN-based semiconductor layer is adopted, its refractive index is about 2.4. Then, an alumina-based substrate whose refractive index is 1.7 is adopted by way of example. As a result, light is totally reflected by the substrate so as to reach the side surface of the light-emitting area and emerge from the side surface. Thus, the light-emitting element is deigned to be higher in external quantum efficiency.

In addition, in the light-emitting element according to the invention (25), each layer of the light-emitting element formed on the substrate is made of a Group III nitride compound semiconductor.

The Group III nitride compound semiconductor is a direct transition type semiconductor whose emission spectrum covers a wide region from an ultraviolet region to a red region when it is formed as a light-emitting element by way of example. Thus, light-emitting diodes (LEDs) having various spectra can be fabricated.

In addition, because of its wide band gap, the Group III nitride compound semiconductor can be formed as a light-emitting element operating more stably at a high temperature than an element using any other semiconductor. Further, when the Group III nitride compound semiconductor does not have arsenic (As) as its main component, it is possible to form a light-emitting element which is safe environmentally.

In addition, in the light-emitting element according to the invention (26), concavities and convexities are formed not only in the side surface of the light-emitting area but also in the top surface thereof.

Concavities and convexities are effective not only in the side surface of the light-emitting area but also in the top surface which is a surface located at the top for extracting light therefrom. For the same reason as in the side surface, that is, because of increase in the net critical angle range, light from the light-emitting area is allowed to emerge from the top surface of the substrate effectively. Since light is allowed to emerge from the side surface and the top surface more effectively, the light-emitting element is designed so that the quantum efficiency further increases.

In consideration of the above (1) to (26), a light-emitting element according to the present invention has at least a concave or convex surface in the whole surface thereof. The concave or convex surface is employed for enhancing the efficiency of extracting light. The concave or convex surface plays as a role of emitting light from itself (light emitting-surface), or plays as a role of reflecting light toward one or other surfaces within the light-emitting element efficiently through the inside of the element. The shape and the location of the concave or convex surface may be modified optionally to enhance the efficiency of extracting light. Thus, a light-emitting element according to one aspect of the invention comprises a light-emitting layer and at least one light-extracting portion, and at least a partial part of the light-extracting portion is formed into a concave or convex surface for enhancing the efficiency of extracting light. A light-emitting element according to another aspect of the invention comprises a light-emitting layer and a concave or convex surface for reflecting light emitted from the light-emitting layer toward one or more other surfaces of the light-emitting element through the inside of the light-emitting element.

Features and advantages of the invention will be evident from the following detailed description of the preferred embodiments described in conjunction with the attached drawings.

BRIEF DESCRIPTION OF THE DRAWINGS

In the accompanying drawings:

FIG. 2 is a longitudinally sectional view showing the configuration of a light-emitting element according to Embodiment 2 of the invention;

FIG. 12 is a sectional view of the configuration of a light-emitting diode according to Embodiment 12 of the invention;

DETAILED DESCRIPTION OF THE PREFERRED EMBODIMENTS

Description will be made below on embodiments of the invention with reference to the drawings.

Embodiment 1

Figure 1A:
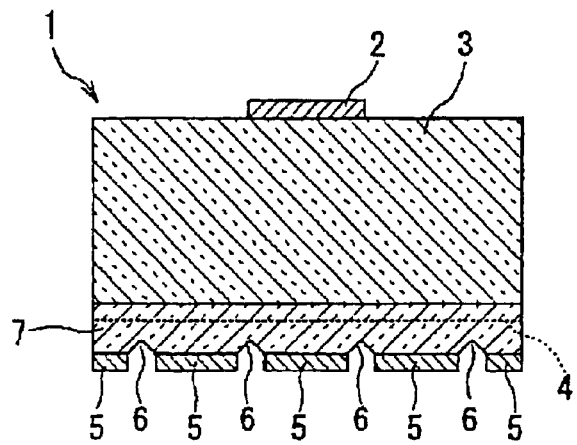
FIG. 1A is a longitudinally sectional view showing the configuration of a light-emitting element according to Embodiment 1 of the invention.
Figure 1B:
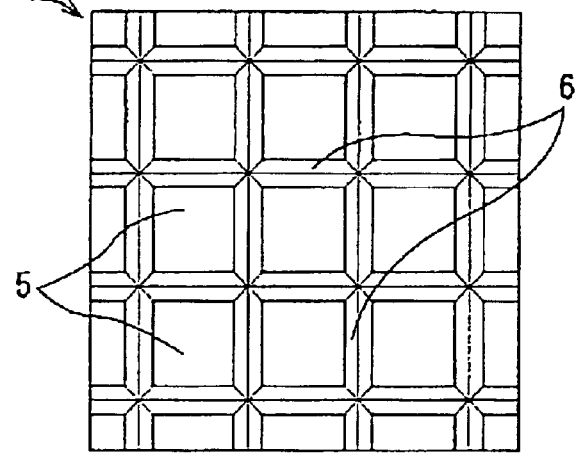
FIG. 1B is a bottom view thereof.

First, description will be made on Embodiment 1 of the invention with reference to FIGS. 1A to 1C. FIG. 1A is a longitudinal sectional view showing the configuration of a light-emitting element according to Embodiment 1 of the invention; FIG. 1B is a bottom view thereof; and FIG. 1C is a diagram for explaining the positional relationship between reflecting grooves and a light-emitting layer.

As shown in FIG. 1A, in a light-emitting element 1 according to Embodiment 1, a GaAs-based crystal layer 7 is epitaxially grown on a GaAs substrate 3 (refractive index n=3.0) so that a light-emitting layer 4 is formed. Then, the substrate 3 side is set as the top surface, and the crystal layer 7 side is set as the bottom surface. An electrode 2 with one polarity is provided on a central portion of the substrate 3 while an electrode 5 with the other polarity is provided all over the bottom surface of the crystal layer 7. After that, wedge-like reflecting grooves 6 are formed at regular intervals on the bottom surface side. As shown in FIG. 1B, the wedge-like reflecting grooves 6 are formed into a lattice structure in the bottom surface of the light-emitting element 1 so that the electrode 5 on the bottom surface side is divided longitudinally and transversely.

Figure 1C:
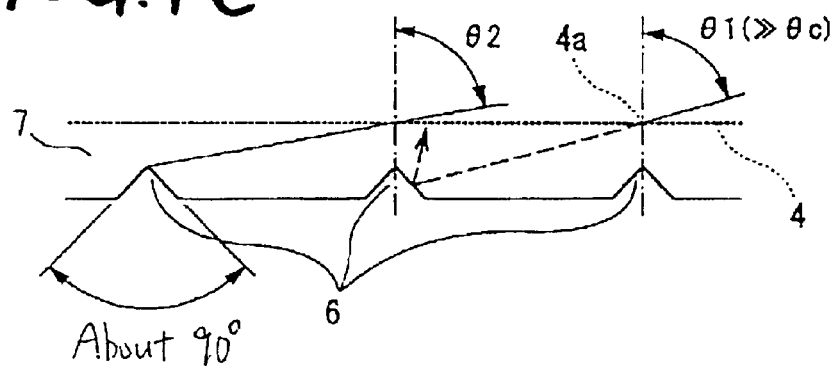
FIG. 1C is a diagram for explaining the positional relationship between reflecting grooves and a light-emitting layer.

As shown in FIG. 1C, the angle of the wedge of each of the reflecting grooves 6 is about 90 degrees, and the light-emitting layer 4 is located on the bottom surface side in the light-emitting element 1 according to Embodiment 1. Accordingly, light radiated in a direction obliquely downward but close to the horizon can be also reflected upward by the reflecting grooves 6. An angle θ1 of radiated light between the line of a light-emitting point 4a extended to a reflecting groove 6 and the line of an apex portion of an adjacent reflecting groove 6 has to be much larger than a critical angle θc from the crystal layer 7 to the outside. In addition, it is desired that an angle θ2 between the line of a light-emitting point extended to a reflection angle 6 and the line of an apex portion of an adjacent reflection angle 6 is as large as possible. That is, it is desired that the light-emitting layer 4 and the apex portions of the reflection angles 6 are as close to each other as possible. Thus, light is reflected upward by the reflecting grooves 6 and radiated externally from the substrate 3. Otherwise, when the reflecting grooves 6 are absent, the light will be reflected laterally by the bottom surface of the crystal layer 7 so as to be confined in and absorbed in the crystal layer 7.

In such a manner, in the light-emitting element 1 according to Embodiment 1, the light-emitting layer 4 is located on the bottom surface side so that light radiated in a direction obliquely downward but close to the horizon can be also reflected upward by the reflecting grooves 6. Thus, the light-extracting efficiency increases so that the light output can be improved.

Embodiment 2

Next, description will be made on Embodiment 2 of the invention with reference to FIG. 2. FIG. 2 is a longitudinal sectional view showing the configuration of a light-emitting element according to Embodiment 2 of the invention. Incidentally, parts the same as those in Embodiment 1 are referenced correspondingly, and the description of these parts will be omitted.

As shown in FIG. 2, a light-emitting element 11 according to Embodiment 2 is different from the light-emitting element 1 according to Embodiment 1 in that reflecting grooves 12 are formed to go through the light-emitting layer 4 so as to reach a height above the light-emitting layer 4. As a result, not only light radiated horizontally from each light-emitting point in the light-emitting layer 4 but also light radiated somewhat obliquely upward can be reflected upward by the reflecting grooves 12 formed to go through the light-emitting layer 4. Thus, almost the whole part of the light radiated laterally with a large light quantity can be radiated externally.

In such a manner, in the light-emitting element 11 according to Embodiment 2, almost the whole part of the light radiated laterally from each light-emitting point in the light-emitting layer 4 can be reflected upward. Thus, the light-extracting efficiency is further increased so that the light output can be further improved.

Embodiment 3

Figure 3A:
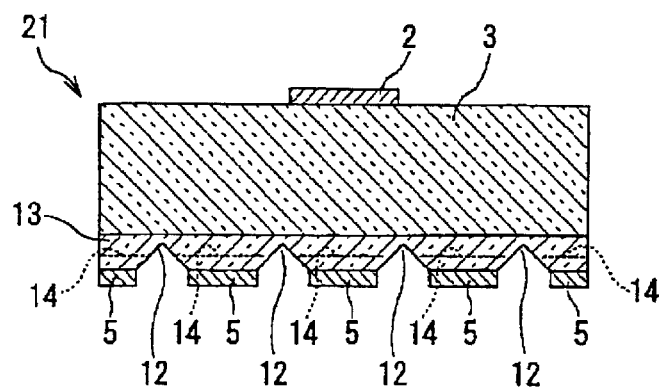
FIG. 3A is a longitudinally sectional view showing the configuration of a light-emitting element according to Embodiment 3 of the invention.
Figure 3B:
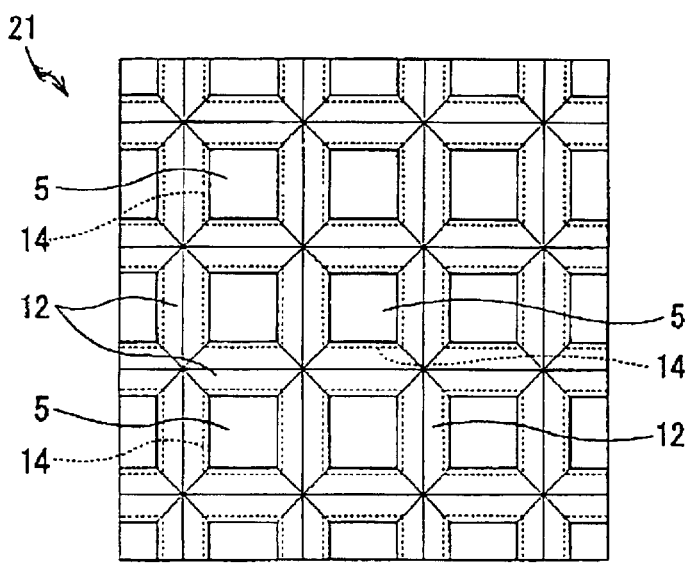
FIG. 3B is a bottom view thereof.

Next, description will be made on Embodiment 3 of the invention with reference to FIGS. 3A and 3B. FIG. 3A is a longitudinally sectional view showing the configuration of a light-emitting element according to Embodiment 3 of the invention, and FIG. 3B is a bottom view thereof. Incidentally, parts the same as those in Embodiments 1 and 2 are referenced correspondingly, and the description of these parts will be omitted.

As shown in FIGS. 3A and 3B, a light-emitting element 21 according to Embodiment 3 is different from the light-emitting elements 1 and 11 according to Embodiments 1 and 2 in that the light-emitting area of a light-emitting layer 14 is formed as split light-emitting areas formed in places except the places where the reflecting grooves 12 are formed. Then, the reflecting grooves 12 are formed to go through the portions where the light-emitting layer 14 is not formed in the crystal layer 13, so as to reach the height above the light-emitting layer 14. As a result, the influence of the formed reflecting grooves 12 on the light-emitting layer 14 can be reduced. Thus, this embodiment can be applied even to the case where the light-emitting layer 14 is weak physically. The same effect can be obtained in the case where the reflecting grooves 12 are formed to reach the height above the light-emitting layer 14 as in the light-emitting element 21 according to Embodiment 3, and in the case where the reflecting grooves 6 do not reach the light-emitting layer 4 as in the light-emitting element 1 according to Embodiment 1.

Then, when the reflecting grooves 12 are formed to reach the height above the light-emitting layer 14, not only light radiated horizontally from each light-emitting point in the light-emitting layer 14 but also light radiated somewhat obliquely upward can be reflected upward by the reflecting grooves 12. Thus, almost the whole part of the light radiated laterally in a large light quantity can be radiated externally.

In such a manner, in the light-emitting element 21 according to Embodiment 3, it can be applied even to the case where the light-emitting layer 14 is weak physically, while almost the whole part of the light radiated laterally from each light-emitting point in the light-emitting layer 14 can be reflected upward. Thus, the light-extracting efficiency is further increased so that the light output can be further improved.

Embodiment 4

Figure 4A:
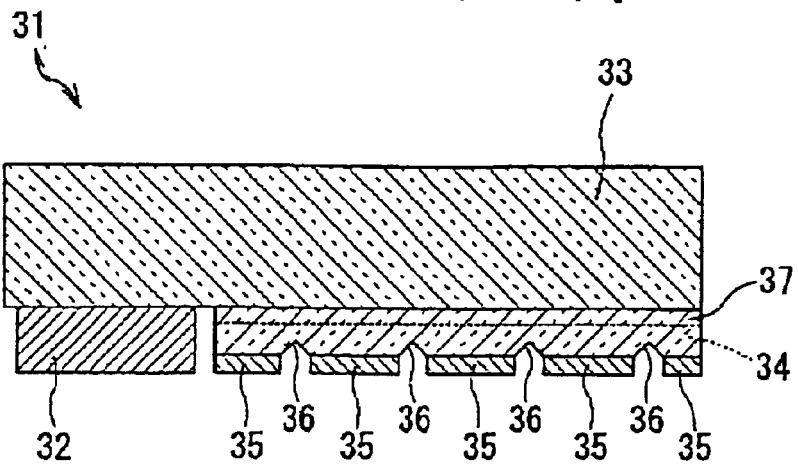
FIG. 4A is a longitudinally sectional view showing the configuration of a light-emitting element according to Embodiment 4 of the invention.

Next, description will be made on Embodiment 4 of the invention with reference to FIGS. 4A and 4B. FIG. 4A is a longitudinally sectional view showing the configuration of a light-emitting element according to Embodiment 4 of the invention, and FIG. 4B is a bottom view thereof.

As shown in FIG. 4A, in a light-emitting element 31 according to Embodiment 4, a GaN-based crystal layer 37 (refractive index n=2.4) is epitaxially grown on an $Al_2O_3$ substrate 33 (n=1.7) so that a light-emitting layer 34 is formed. Then, the substrate 33 side is set as the top surface, and the crystal layer 37 side is set as the bottom surface. One corner of the crystal layer 37 is removed so that an electrode 32 with one polarity is provided on the bottom surface of the substrate 33, while an electrode 35 with the other polarity is provided all over the bottom surface of the crystal layer 37. That is, in the light-emitting element 31, the electrodes opposite in polarity are formed on the bottom surface side. Then, wedge-like reflecting grooves 36 are formed at regular intervals on the bottom surface side of the crystal layer 37.

Figure 4B:
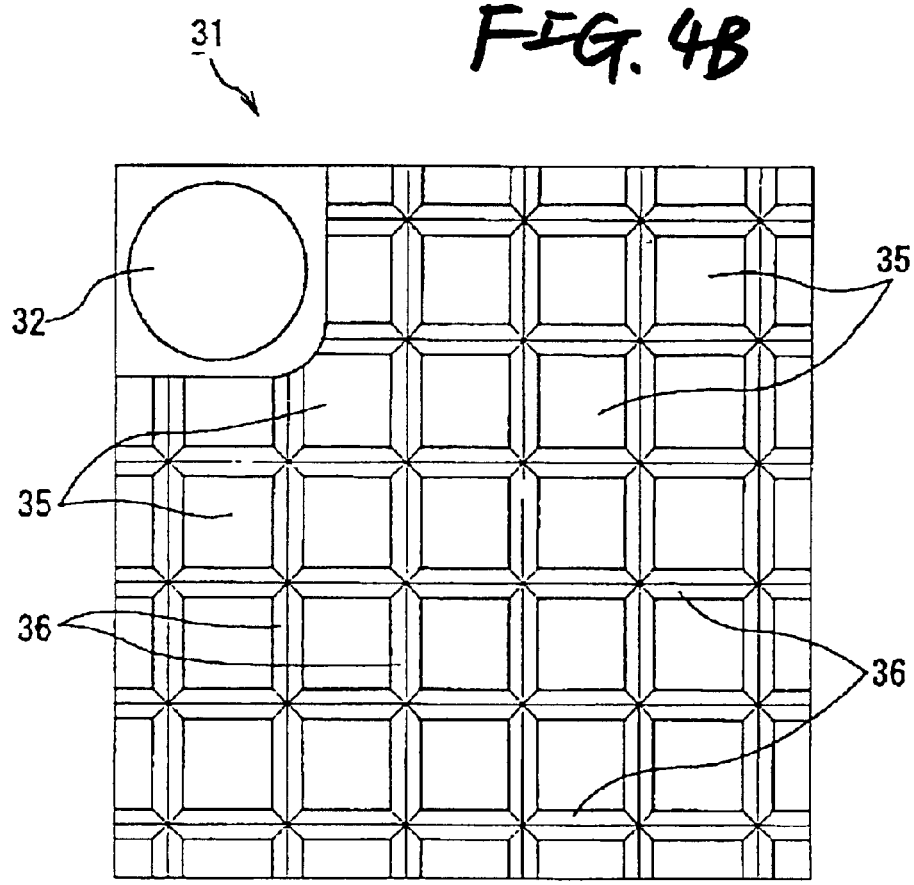
FIG. 4B is a bottom view thereof.

As shown in FIG. 4B, the wedge-like reflecting grooves 36 are formed in a lattice structure in the bottom surface of the light-emitting element 31 so that the electrode 35 on the bottom surface side of the crystal layer 37 is divided longitudinally and transversely.

In such a manner, in the light-emitting element 31 according to Embodiment 4, the electrodes opposite in polarity are formed on the bottom surface side so that it is not necessary to form any electrode on the top surface. Accordingly, even if the light-emitting element 31 is formed into a small chip, it is possible to maintain the effect to reflect light from the light-emitting layer 34 upward by the reflecting grooves 36 formed in the bottom surface of the crystal layer 37 so as to improve the external radiation efficiency. Then, when the light-emitting element 31 is formed into a small chip, the course in which light is reflected several times in the crystal layer 37 and then radiated externally becomes short enough to reduce the ratio of light absorbed in the crystal layer 37 which is high in light absorptance. Thus, the external radiation efficiency is further improved. Not to say, even if the light-emitting element 31 is formed into a large chip, it is possible to obtain the effect to reflect light from the light-emitting layer 34 upward by the reflecting grooves 36 formed in the bottom surface of the crystal layer 37 so as to improve the external radiation efficiency.

Further, since the $Al_2O_3$ substrate 33 having a lower refractive index (n=1.7) than the refractive index (n=2.4) of the GaN-based crystal layer 37 including the light-emitting layer 34 is located above the light-emitting layer 34, light radiated laterally from the light-emitting layer 34 is confined in the crystal layer 37 high in refractive index. Accordingly, of the light radiated laterally, light having an upward component is also reflected upward by the reflecting grooves 36 formed in the bottom surface of the crystal layer 37. As a result, the ratio of light reflected upward increases so that the external radiation efficiency is further improved.

In such a manner, in the light-emitting element 31 according to Embodiment 4, it is not necessary to form any electrode on the top surface. Accordingly, the light-emitting element 31 can be formed into a small chip so that the external radiation efficiency is further improved. In addition, since the substrate 33 having a low refractive index is located above the light-emitting layer 34, light confined in the light-emitting layer 34 having a high refractive index is reflected upward, while the critical angle at each interface increases so that it becomes easy to extract the light. Thus, the external radiation efficiency is further increased so that the light output can be improved.

In each embodiment, although description has been made on an example in which the reflecting grooves are formed longitudinally and transversely in a lattice structure, the reflecting grooves may be formed obliquely to the outline of the bottom surface of the light-emitting element, or may be formed into a pattern in which grooves are formed longitudinally, transversely and obliquely. In addition, although description has been made on the case where each reflecting groove has a sectional shape like a wedge with about 90 degrees, each reflecting groove may have any sectional shape so long as the shape can reflect light from the light-emitting layer upward with good efficiency. Further, although description has been made on the case where the reflecting grooves are formed at regular intervals, the reflecting grooves do not have to be always formed at regular intervals.

Embodiment 5

Figure 5A:
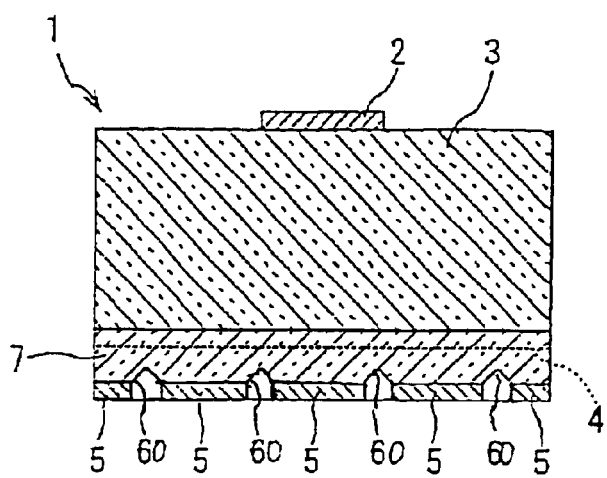
FIG. 5A is a longitudinally sectional view showing the configuration of a light-emitting element according to Embodiment 5 of the invention.
Figure 5B:
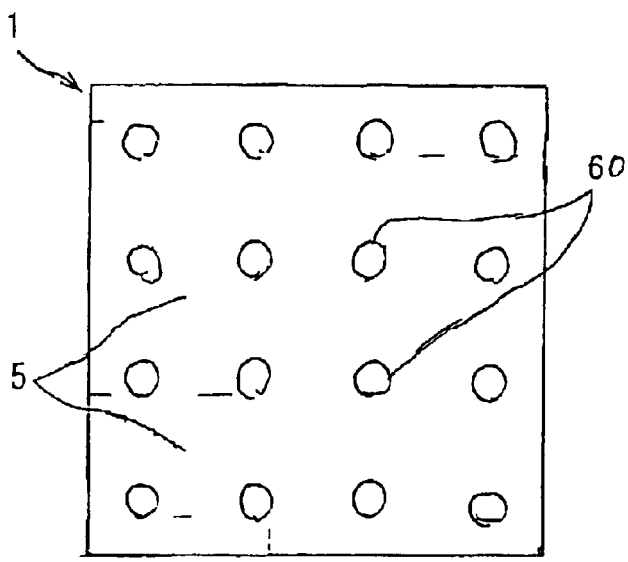
FIG. 5B is a bottom view thereof.

Further, in each embodiment, although description has been made on the case where the reflecting grooves are formed to reflect light from the light-emitting layer upward, reflecting holes 60 each having a conical shape or the like may be formed over the bottom surface of the light-emitting element as shown in FIG. 5, in place of the reflecting grooves. Further, both the reflecting grooves and the reflecting holes may be formed in the bottom surface of the light-emitting element.

Further, although description has been made on the case where the light-emitting layer is set on the bottom surface side with respect to the substrate, the invention is not limited thereto. For example, when the light-emitting element has a large size (with the same thickness), it is also effective that the light-emitting layer is set on the top side.

In each of the embodiments hereinafter, the portion as a whole for extracting light from a light-emitting element is referred to as a "light-extracting portion", and respective surfaces constituting the light-extracting portion are referred to as "light-extracting surfaces", in order to distinguish the whole from the parts.

Embodiment 6

Figure 6A:
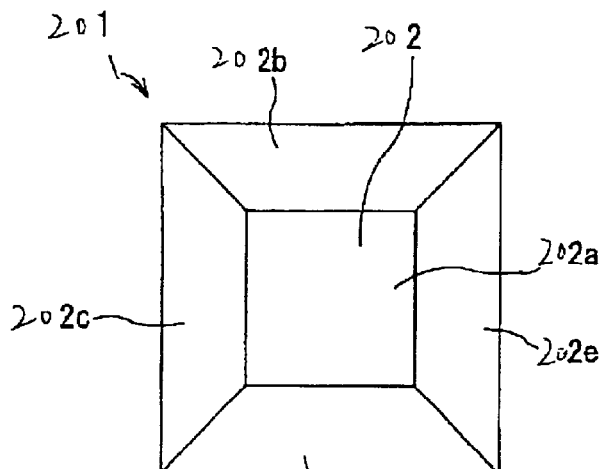
FIG. 6A is a plan view showing the configuration of a light-emitting element according to Embodiment 6 of the invention.

First, description will be made on Embodiment 6 of the invention with reference to FIGS. 6A to 6C. FIG. 6A is a plan view showing the configuration of a light-emitting element according to Embodiment 6 of the invention, FIG. 6B is a longitudinal sectional view thereof, and FIG. 6c is a bottom view thereof.

Figure 6B:
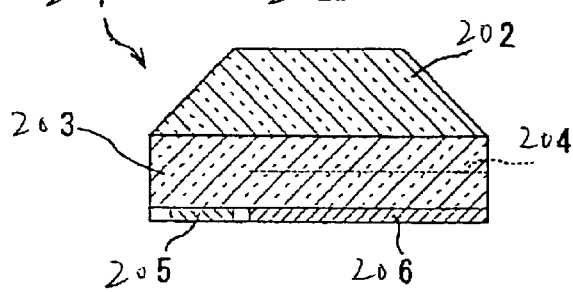
FIG. 6B is a longitudinal sectional view thereof.
Figure 6C:
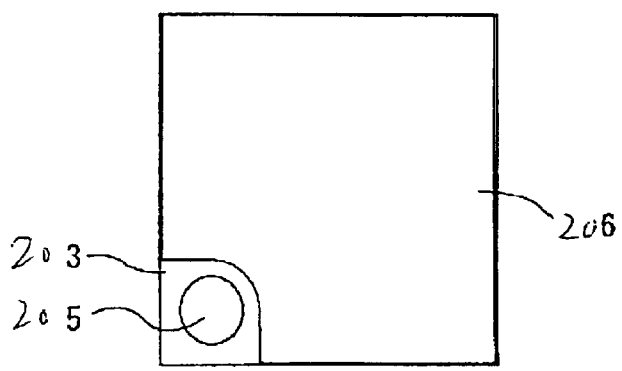
FIG. 6c is a bottom view thereof.

As shown in FIG. 6B, in the light-emitting element 201 according to Embodiment 6, a crystal layer 203 made of GaN (refractive index n=2.4) is epitaxially grown on an SiC substrate 202 (n=2.5) so that a light-emitting layer 204 is formed (excluding the portion above an electrode 205). When the substrate 202 side is set as the top surface while the crystal layer 203 side is set as the bottom surface, the electrode 205 with one polarity and an electrode 206 with the other polarity are formed on the bottom surface of the crystal layer 203, as shown in FIG. 6C. Further, as shown in FIG. 6A, four sides in the upper surface of the SiC substrate 202 are chipped off obliquely so as to form a truncated pyramid in the upper surface. In the truncated pyramid, five surfaces (202a, 202b, 202c, 202d, and 202e) are formed as light-extracting surfaces. The angle of each oblique portion is about 45 degrees, and the light-emitting element 201 as a whole is shaped like a form near a hemispherical form.

Because the light-emitting element 201 has such a configuration, refractive index of light emitted from the light-emitting layer 204 in the GaN crystal layer 203 is substantially equal to that at the interface with the substrate 202. Therefore, the light is not confined in the interface and almost the whole part of the light passes through the interface directly. At the interface between the substrate 202 and the air, the ratio of the light incident within the critical angle is high because the four sides in the upper surface of the substrate 202 are chipped off obliquely. As a result, external radiation efficiency of the primary light increases, and external radiation efficiency of the secondary light et seq. also increases, so that the light-extracting efficiency is improved with the result that the external quantum efficiency can be improved greatly. Further, although the light-emitting element 201 is mounted on metal high in heat conductivity, the light-emitting element 201 has the light-emitting layer located on the bottom surface side so that the heat radiation property for externally radiating the heat generated in the light-emitting layer can be enhanced. Further, as the efficiency is enhanced, the heat generation rate can be reduced, and the heat radiation property of the light-emitting element can be enhanced. Accordingly, the input allowable electric power increases, so that higher output in combination with higher efficiency can be attained.

Incidentally, work for forming the light-extracting surfaces is to work the substrate simply into a lattice structure, and the cut surfaces (202b, 202c, 202d, and 202e) of the SiC substrate 2 to be the light-extracting surfaces can be formed in a specular state by adjusting the rotation speed and cut speed of the diamond cutter. For this reason, the light-emitting element can be manufactured easily and is excellent in manufacturability.

In such a manner, in the light-emitting element 201 according to Embodiment 6, a gallium nitride crystal layer is formed on a silicon carbide substrate having a refractive index near to that of the gallium nitride crystal layer, so that it is possible to obtain a light-emitting element in which the efficiency of extracting light from the light-emitting layer is high, the heat generation rate is low, and light output is high.

Embodiment 7

Figure 7:
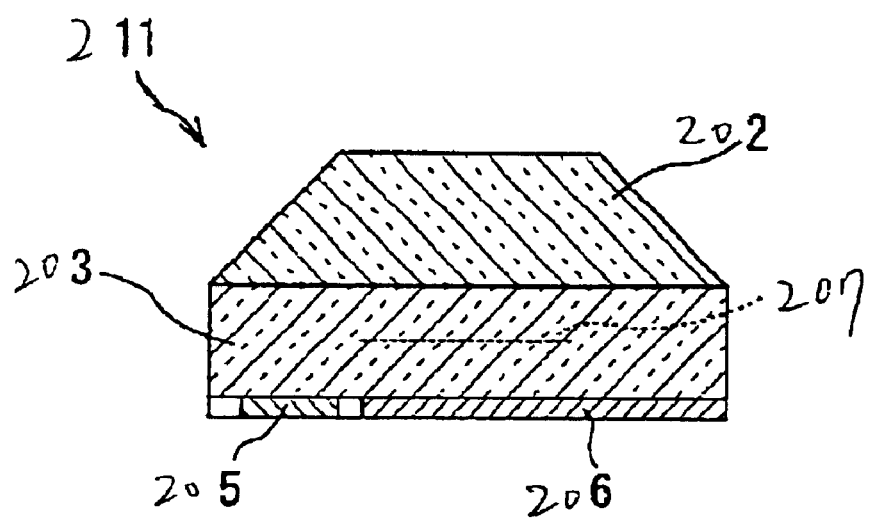
FIG. 7 is a longitudinal sectional view showing the configuration of a light-emitting element according to Embodiment 7 of the invention.

Next, description will be made on Embodiment 7 of the invention with reference to FIG. 7. FIG. 7 is a longitudinal sectional view showing the configuration of a light-emitting element according to Embodiment 7 of the invention. Incidentally, parts the same as those in Embodiment 6 are referenced correspondingly and the description of these parts will be omitted partially.

A light-emitting element 211 according to Embodiment 7 is different from the light-emitting element 201 according to Embodiment 6 in that a light-emitting layer 207 is formed in the central portion of a gallium nitride crystal layer 203. In comparison with the light-emitting element 201 in which the light-emitting layer 204 is formed all over the whole surface in the crystal layer 203 except the surface above the electrode 205, the light-emitting portion for the light-extracting surfaces in the light-emitting element 211 approximates a point light source and is located in the vicinity of the central portion of the light-extracting surfaces. In this configuration, the light emitted from the light-emitting layer 207 generally forms a deeper angle of incidence onto any one of the light-extracting surfaces compared with Embodiment 6, so that the external radiation efficiency of the primary light further increases and the light-extracting efficiency can be enhanced. Accordingly, when a chip size of the light-emitting element 211 is approximately the same as that of the light-emitting element 201, the efficiency of externally extracting the light emitted from the light-emitting layer is improved so that it is possible to obtain an energy saving light-emitting element which can gain the same emission output with less electric power than the related-art element. Further, when the chip size is increased so as to increase the light-emitting area of the light-emitting layer 207 in the light-emitting element 211 to be substantially the same as that of the light-emitting layer 204 in the light-emitting element 201, it is possible to obtain the larger output with the same electric power as the related-art element. Further, when the generated heat is reduced and the heat radiation property is improved, larger electric power than that of the related-art element can be inputted so that the larger output can be attained.

At present, energy saving and higher efficiency is often requested of the LED light source for serving as the light source for a mobile apparatus, and higher output is often requested of the LED light source for serving as the light source substituted for the incandescent lamp. According to the configuration of the light-emitting element 211 in Embodiment 7, both the requests can be met as described above.

In such a manner, in the light-emitting element 211 according to Embodiment 7, the light-emitting layer is formed as a point light source, so that it is possible to obtain a light-emitting element which can be further improved in the efficiency and enhanced in output.

Embodiment 8

Figure 8:
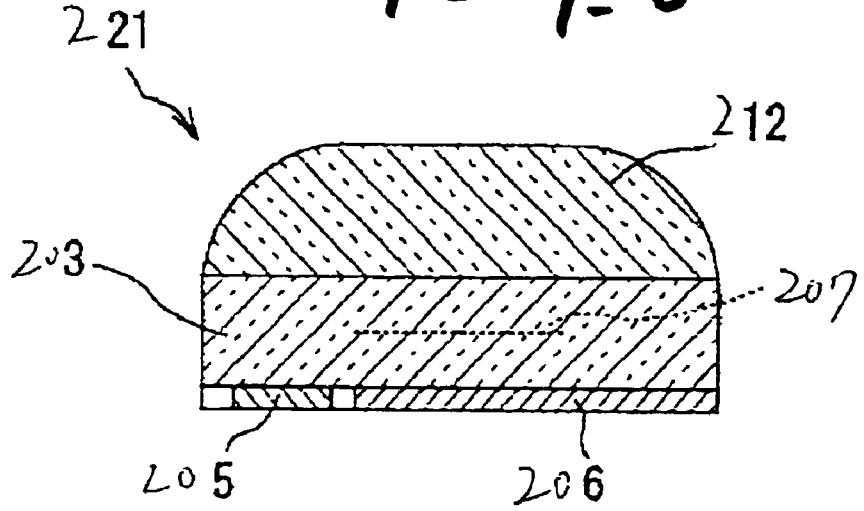
FIG. 8 is a longitudinal sectional view showing the configuration of light-emitting element according to Embodiment 8 of the invention.

Next, description will be made on Embodiment 8 according to the invention with reference to FIG. 8. FIG. 8 is a longitudinal sectional view showing the configuration of light-emitting element according to Embodiment 8 of the invention. Incidentally, parts the same as those in Embodiments 6 and 7 are referenced correspondingly, and the description of these parts will be partially omitted.

A light-emitting element 221 according to Embodiment 8 is different from the light-emitting element 211 according to Embodiment 7 in that light-extracting surfaces 202b, 202c, 202d and 202e of an SiC substrate 212 are shaped like cylindrical surfaces. Each of the cylindrical surfaces is a cylindrical surface with the central portion of the light-emitting layer as an origin. In such a manner, light emitted from the light-emitting layer 207 forms a further deeper angle of incidence onto each light-extracting surface so that the incidence approaches perpendicular incidence. Accordingly, the external radiation efficiency of the primary light can further increase and the light-extracting efficiency can be enhanced. Further, when the chip size of the light-emitting element 221 is made to be substantially equal to that of the light-emitting element 201, the output reduction due to heat generation can be lightened by reduction of internal heat generation, so that improvement in the efficiency can be attained. Further, when the width of the chip size is enlarged, and the width of the light-emitting area in the light-emitting layer 207 of the light-emitting element 221 is enlarged to be substantially the same as the width of the light-emitting area in the light-emitting layer 204 of the light-emitting element 201, a conduction current can be set to a large value, so that higher output can be attained.

Accordingly, in the light-emitting element 221 according to Embodiment 8, the light-emitting portion is formed to be a portion approximating a point light source in the same manner as in Embodiment 7, so that it is possible to obtain a light-emitting element which can be improved further more in efficiency and enhanced in output.

In the respective embodiments, although description has been made on the case where the light-extracting portion is constituted by five surfaces, the invention is not limited thereto. If the total shape of the light-extracting portion is substantially convex, there is an effect to improve the light-extracting efficiency. The invention includes various modes, such as a mode in which the light-extracting portion is constituted by a hemispherical surface, a mode in which the light-extracting portion is constituted by nine side surfaces into two stages, and a mode in which the light-emitting element is not shaped like a form cut into a square, but is cut into a hexagon with seven light-extracting surfaces.

Embodiment 9

Figure 9A:
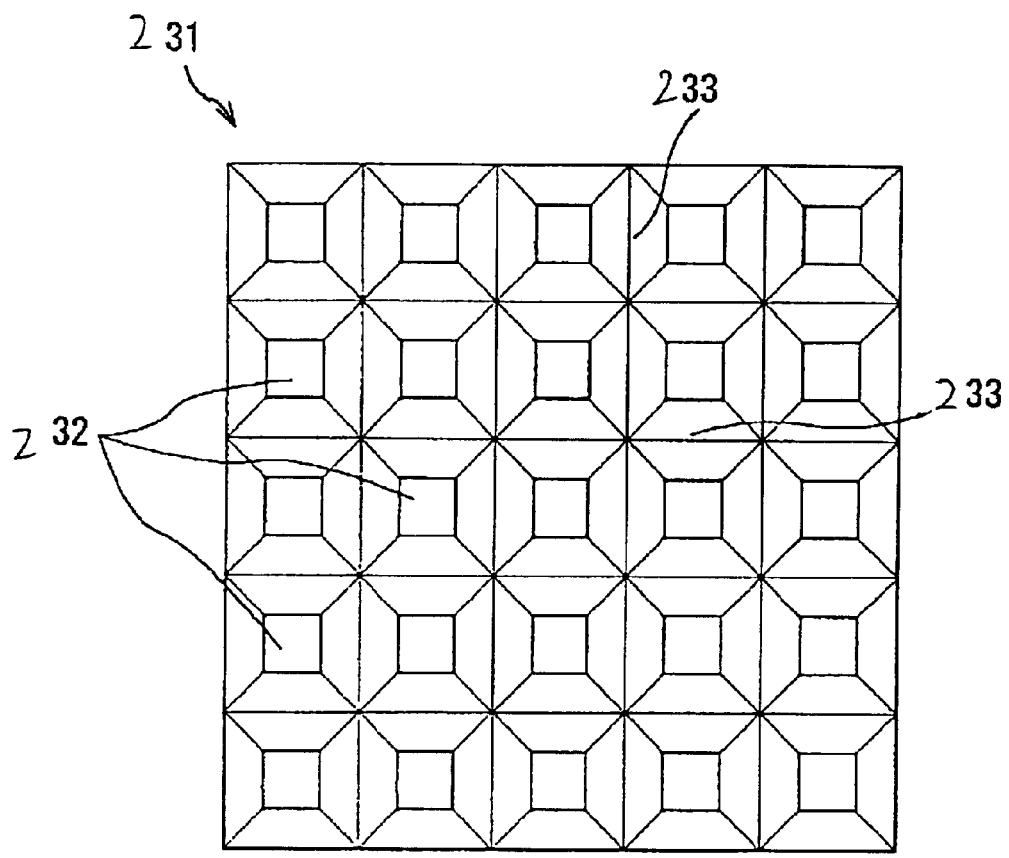
FIG. 9A is a plan view showing the configuration of a light-emitting element according to Embodiment 9 of the invention.
Figure 9B:
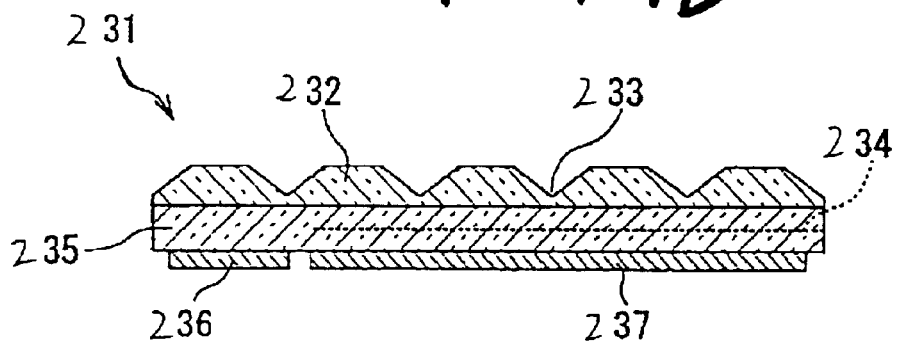
FIG. 9B is a longitudinal sectional view thereof.

Next, description will be made on Embodiment 9 of the invention with reference to FIGS. 9A and 9B. FIG. 9A is a plan view showing the configuration of a light-emitting element according to Embodiment 9 of the invention, and FIG. 9B is a longitudinal sectional view thereof.

As shown in FIG. 9A, in a light-emitting element 231 according to Embodiment 9, an SiC substrate 232 is cut longitudinally by four grooves 233 and transversely by four grooves 233, each grooves 233 being shaped like a V-form and having an angle of 45°. The SiC substrate 232 is divided, in a lattice structure, into twenty-five truncated pyramids each serving as a light-extracting portion. In such a manner, the SiC substrate 232 serving as the emerging surface is divided into twenty-five truncated pyramids and arranged in a lattice structure, so that light emitted from a light-emitting layer 34 in a GaN crystal layer 235 is extracted efficiently from each of the truncated pyramids to obtain high external radiation efficiency, even in the case where the height of the SiC substrate 232 is low relative to the width of the light-emitting element 231, as shown in FIG. 9B. Accordingly, even in the case where the chip size of the light-emitting element is made larger, efficiency the same as in Embodiment 6 can be expected in this embodiment and a yield of the light-emitting elements from a base material can be improved. That is, when the chip size is made larger in a similar shape to that of the light-emitting element 201 according to Embodiment 6 as shown in FIGS. 6A and 6B, it is necessary to make the wafer thick and the yield of the light-emitting elements from the material is reduced. When the light-emitting element 231 according this embodiment is used, the wafer thickness is not changed, and efficiency similar to that of a light-emitting element 201 of Embodiment 6 made large in dicing size can be expected. In addition, a high yield of the light-emitting elements from the material can be obtained for effective utilization. Further, since the light-emitting element is formed into a plurality of truncated pyramids in a lattice structure, there is an advantage in facilitating manufacturing.

In such a manner, in the light-emitting element 231 according to Embodiment 9, the SiC substrate 232 serving as the emerging surface is divided into twenty-five truncated pyramids in a lattice structure, so that high external quantum efficiency can be obtained and the yield of the light-emitting elements from the base material can be improved, even in the case where the chip size of the light-emitting element is made larger. Further, when the light-emitting element is formed in a lattice structure, manufacturing becomes easy.

Incidentally, although description has been made on the case where twenty-five truncated pyramids serving as the light-extracting portions are arranged in a lattice structure in the light-emitting element 231 according to Embodiment 9, the invention is not limited thereto. Even in the case where a plurality of light-extracting portions are arranged in any manner so as to make the chip size of the light-emitting element large, high external quantum efficiency can be obtained and the yield of the light-emitting elements from the base material can be improved.

Embodiment 10

Figure 10A:
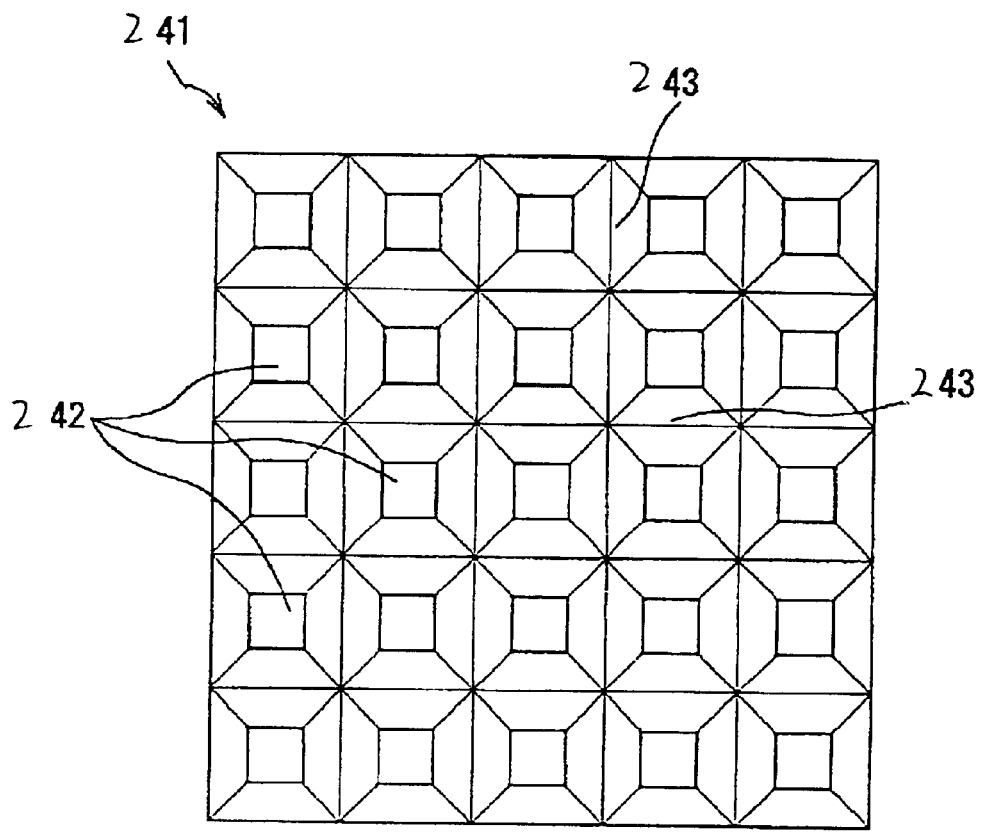
FIG. 10A is a plan view showing the configuration of a light-emitting element according to Embodiment 10 of the invention.
Figure 10B:
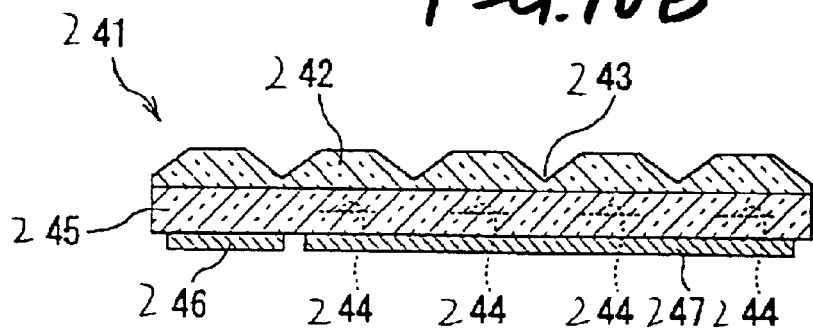
FIG. 10B is a longitudinal sectional view thereof.

Next, description will be made on Embodiment 10 of the invention with reference to FIGS. 10A and 10B. FIG. 10A is a plan view showing the configuration of a light-emitting element according to Embodiment 10 of the invention, and FIG. 10B is a longitudinal sectional view thereof.

As shown in FIG. 10A, in a light-emitting element 241 according to Embodiment 10, an SiC substrate 242 is cut longitudinally by four V-shaped grooves 243 and transversely by four V-shaped grooves 243, so that the SiC substrate 242 is divided into twenty-five truncated pyramids. Further, a light-emitting layer 244 in a GaN crystal layer 245 is formed in the portions corresponding to the flat surface portions of the respective truncated pyramids so as to be formed as a point light source. In such a manner, light-extracting efficiency can be further improved. In addition, when the SiC substrate 242 serving as the emerging surface is divided into twenty-five truncated pyramids thus, external quantum efficiency can be prevented from being lowered in the same manner as in Embodiment 9, even in the case where the chip size of the light-emitting element is made larger. Further, when portions of the light-emitting layer 244 are separated from each other, heat localization in the light-emitting layer 244 can be prevented so that lowering in the light-emitting efficiency due to the heat can be suppressed greatly.

In such a manner, in the light-emitting element 241 according to Embodiment 10, the light-emitting layer 244 can be formed as a point light source, so that the light-extracting efficiency can be improved further. In addition, when the portions of the light-emitting layer 244 are separated from each other, lowering in light-emitting efficiency due to heat localization can be suppressed greatly.

Embodiment 11

Figure 11A:
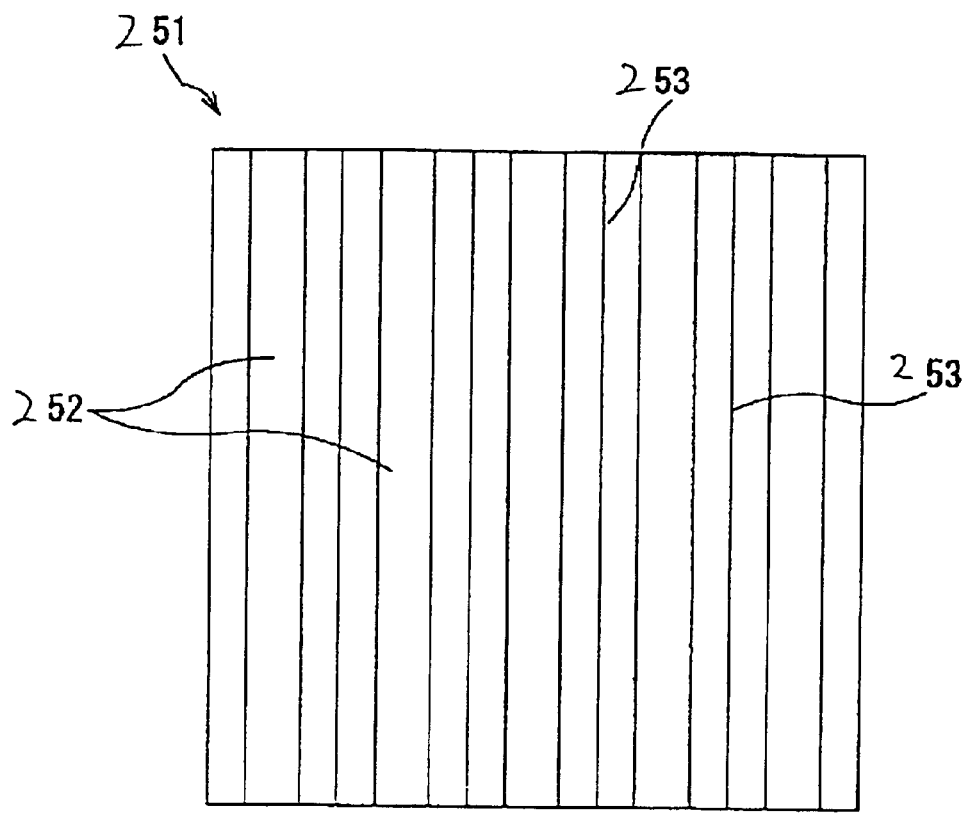
FIG. 11A is a plan view showing the configuration of a light-emitting element according to Embodiment 11 of the invention.
Figure 11B:
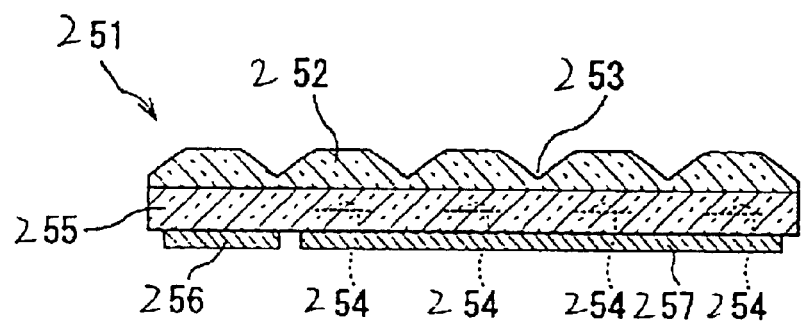
FIG. 11B is a longitudinal sectional view thereof.

Next, description in Embodiment 11 of the invention will be made with reference to FIGS. 11A and 11B. FIG. 11A is a plan view showing the configuration of a light-emitting element according to Embodiment 11 of the invention, and FIG. 11B is a longitudinal sectional view thereof.

As shown in FIG. 11A, in a light-emitting element 251 according to Embodiment 11, an SiC substrate 252 is cut only longitudinally by four V-shaped grooves 253 so that the SiC substrate 242 is divided into five rod-like trapezoids. A light-emitting layer 254 is formed only in the portions of a GaN crystal layer 255 corresponding to the flat surface portions of the rod-like trapezoids (except the portion above an electrode 256). Accordingly, the light-emitting layer 254 is formed as a rod-like light source extending in the direction perpendicular to the paper plane of FIG. 11B. Thus, as shown in FIG. 11B, even in the case where the height of the SiC substrate 252 is low relative to the width of the light-emitting element 251, light emitted from the light-emitting layer 254 in the GaN crystal layer 255 can be extracted efficiently from the respective rod-like trapezoids so that high external radiation efficiency can be obtained. As a result, external quantum efficiency can be prevented from being lowered even in the case where the chip size of the light-emitting element is made larger.

Incidentally, although improvement in the light-extracting efficiency in this embodiment cannot be expected equally to that in Embodiment 10, work can be simplified and the light-extracting efficiency can be improved compared with the related art.

In this manner, in the light-emitting element 51 according to Embodiment 11, light emitted from the light-emitting layer 254 in the GaN crystal layer 255 can be extracted efficiently from the respective rod-like trapezoids in the state in which the SiC substrate 252 is divided into the five rod-like trapezoids, so that high external radiation efficiency can be obtained. As a result, external quantum efficiency can be prevented from being lowered even in the case where the chip size of the light-emitting element is made larger.

In each of the embodiments, although description has been made on the case where the light-emitting element has a silicon carbide (SiC) substrate, and a gallium nitride (GaN) crystal layer epitaxially grown on the silicon carbide substrate, the invention is not limited thereto. The invention may be applicable to a light-emitting element made of another material, such as a light-emitting element having gallium arsenide (GaAs) and a gallium arsenide-based crystal layer epitaxially grown on the gallium arsenide (GaAs). Alternatively, there may be used a light-emitting element in which the substrate used for crystal growth is removed, and a substrate having high transmittance to the light emitted from the light-emitting element, or a substrate having an equal refractive index to that of the light-emitting layer is stuck onto the light-emitting layer. On this occasion, working into light-extracting surfaces may be carried out on the substrate after the sticking, or a substrate having a surface worked into light-extracting surfaces may be stuck onto the light-emitting layer. In addition, another substrate may be additionally stuck onto the light-emitting element (in order to enhance the degree of freedom for the refractive index and transmittance).

Embodiment 12

Figure 13:
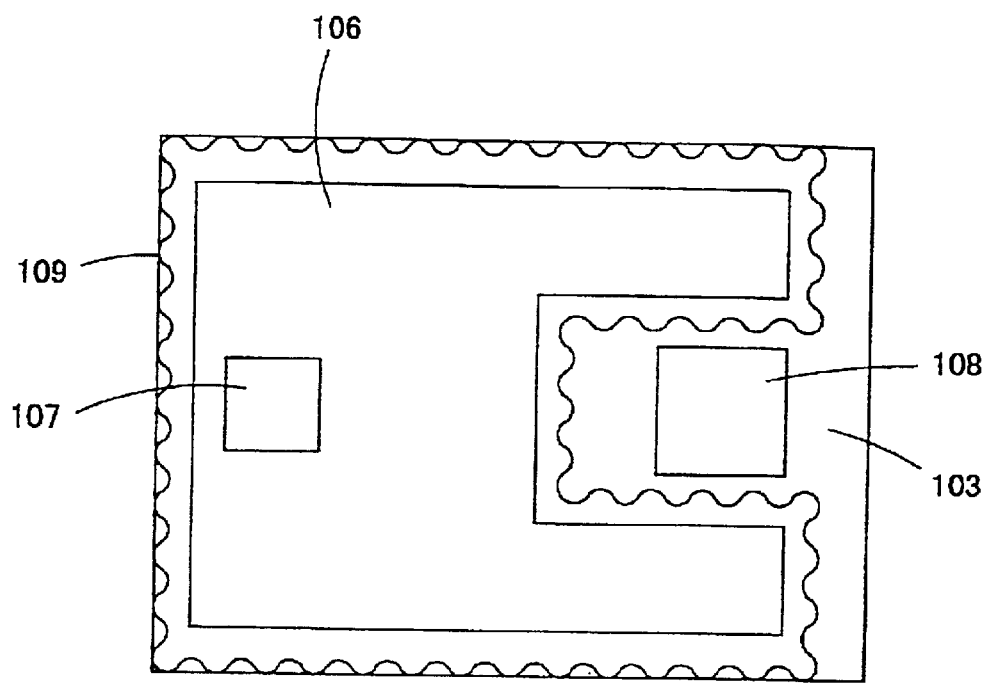
FIG. 13 is a top view of the light-emitting diode according to the Embodiment 12 of the invention.

FIGS. 12 and 13 show a light-emitting diode 100 which implements the light-emitting element of this embodiment. FIG. 12 is a sectional view of the configuration of the light-emitting diode 100, and FIG. 13 is a top view thereof. Incidentally, the light-emitting diode 100 according to this embodiment is an element using Group III nitride compound semiconductors, such as a GaN-based semiconductor. The light-emitting diode 100 according to this embodiment is constituted by a sapphire substrate 101, a buffer layer 102, an n-type layer 103, a light-emitting layer 104 as a light-emitting area, a p-type layer 105, a light-transmissive electrode (anode) 106 formed on the p-type layer 105, a seat electrode (anode) 107, and an electrode (cathode) 108 formed on the n-type layer 103.

In addition, the layers above the n-type layer 103 except the exposed surface of the n-type layer 103 are etched in a "U" shape as shown in FIG. 13. The electrode 108 is formed in the portion surrounded by the "U" shape. Incidentally, the light-emitting layer 104 may have either an MQW structure or an SQW structure.

This embodiment has a feature in that at least the side surface of the light-emitting layer 104 is formed as a concavo-convex side surface 109 as shown in FIGS. 12 and 13. This concavo-convex side surface 109 (corrugated shape) is formed, for example, by patterning in the step of forming the seat electrode 108 as will be described later. Thus, the emergence efficiency from the light-emitting layer 104, that is, the external quantum efficiency is improved.

Figure 14:
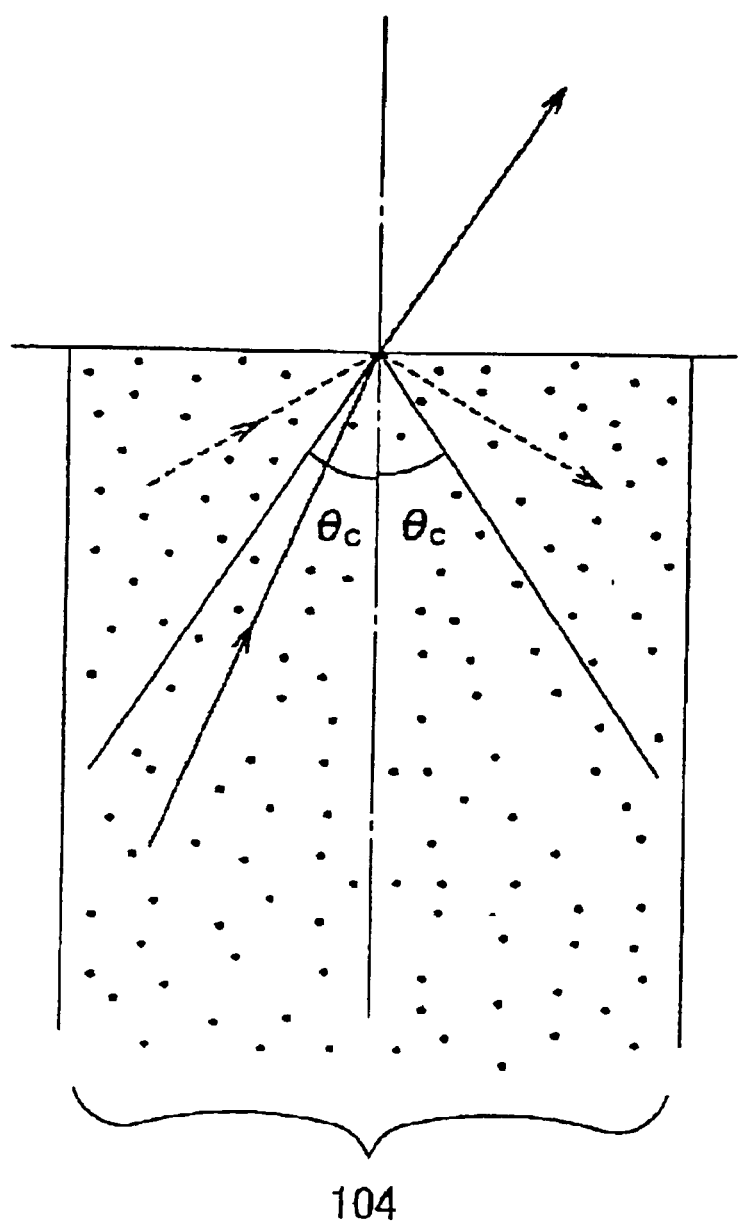
FIG. 14 is a diagram for explaining the relationship between the course of emitted light and a critical angle $\theta_c$ in the light-emitting layer interface of the invention.

For example, as shown in FIG. 14, if the side surface of the light-emitting layer 104 is flat as in the related art, light emitted from the light-emitting layer 104 side satisfies the total reflection conditions because the inside (of light-emitting layer 104) is made of a material high in refractive index while the outside area is a material low in refractive index. That is, of light traveling from the inside to the outside area, light incident at an angle smaller than a critical angle $\theta_c$ depending on the refractive indexes of the inside and the outside area is allowed to emerge to the outside, while light incident at an angle not smaller than the critical angle $\theta_c$ is totally reflected by the interface so as to be confined in the inside. That is, the light is attenuated in the inside. As a result, only the light incident in an angle range smaller than the critical angle range $2\theta_c$ is allowed to emerge.

Figure 15:
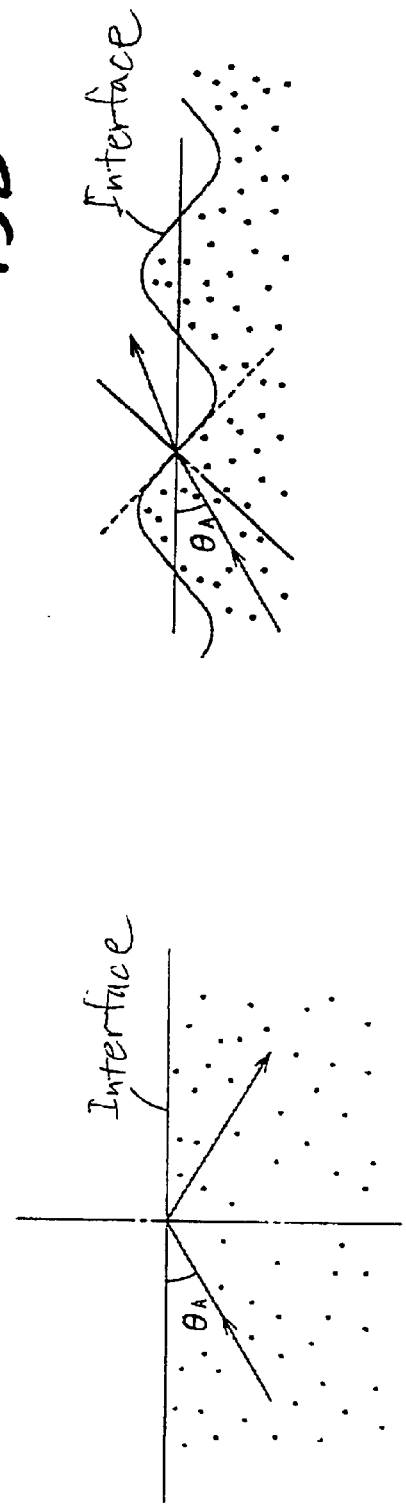
FIGS. 15A and 15B are diagrams for explaining the increase of the critical angle according to the Embodiment 12 of the invention in comparison with the related art.

In contrast, in the light-emitting diode 100 according to this embodiment, at least the side surface of the light-emitting layer 104 is formed as the concavo-convex side surface 109 as shown by the enlarged view of FIG. 15B. When the interface with the outside area is formed thus, not only is the range of the crystal interface in the surface direction expanded, but the area of the crystal interface is also increased. Thus, the external radiation area at the interface is increased. For example, as shown in FIGS. 15A and 15B, light emitted in the same condition (angle $\theta_A$ with respect to the interface) is totally reflected in the related-art example (FIG. 15A) but is made to emerge to the outside in this embodiment (FIG. 15B).

Figure 22A:
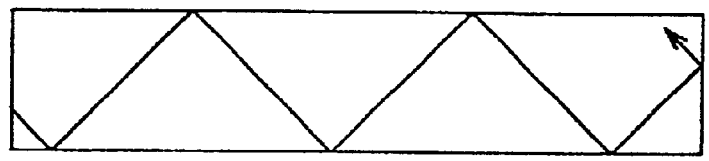
FIGS. 22A and 22B are diagrams for explaining the course of light in a reflection mode in a light-emitting layer in a related-art light-emitting diode.
Figure 22B:
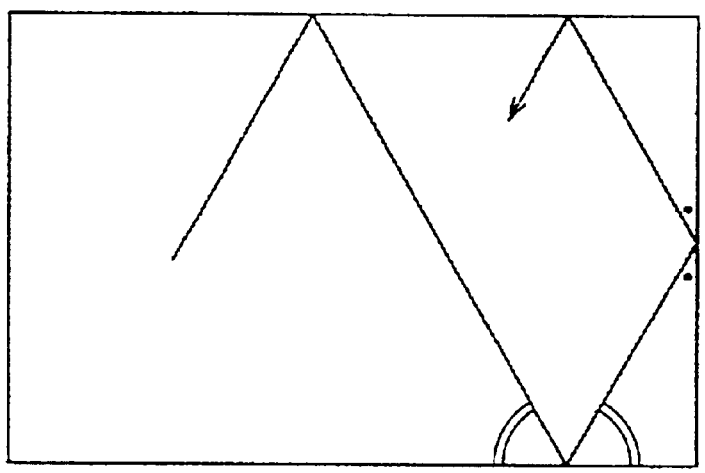

Further, when the concavo-convex shape is made of a curve with a change in curvature, not only is the primary efficiency of extracting light externally from the side surface of the light-emitting layer improved, but the efficiency of extracting light externally subsequently to the primary efficiency is also improved. That is, light incident on the crystal interface in the side surface of the light-emitting layer at an angle not smaller than the critical angle $\theta_c$ so as to be totally reflected therefrom is reflected in a direction in accordance with the interface direction. It is therefore possible to prevent occurrence of such a mode, as shown in FIGS. 22A and 22B, in which light is not radiated externally even after the light is reflected several times in the crystal of the related-art typical light-emitting element having a rectangular shape. Incidentally, FIG. 22A shows the reflection mode in a sectional view of a related-art light-emitting layer, and FIG. 22B shows the reflection mode in a top view thereof.

In addition, although each layer is shown as a thick layer in FIG. 12 for the sake of convenience, the layers as a whole have only a slight thickness relative to the sapphire substrate in fact. Nevertheless the concavo-convex side surface 109 is effective not only in light directly emitted from the light-emitting layer but also in light reflected by the upper and lower interfaces and then reaching the concavo-convex side surface 109. That is, the refractive index of the sapphire substrate is 1.7 while the refractive index of, for example, GaN of the GaN-based semiconductor constituting the light-emitting layer and so on is 2.4. Accordingly, light confined in the light-emitting element between the upper and lower interfaces is classified into light confined in the light-emitting element as a whole and light confined, for example, in the Group III nitride compound semiconductor layer having a large refractive index in the light-emitting element. Thus, optical density is considerably high in the Group III nitride compound semiconductor layer. Thus, a sufficient effect can be obtained by simply forming the concavo-convex side surface 109 having a slight depth.

Next, description will be made on a method for manufacturing the light-emitting diode 100 having such a structure. To manufacture the light-emitting diode 100, first, the layers from the buffer layer 102 to the p-type layer 105 are produced sequentially by vapor phase epitaxy using a metal organic vapor phase epitaxy method (hereinafter referred to as "MOVPE"). Next, an SiO$_2$ layer is formed by sputtering, and photo-resist is applied onto the SiO$_2$ layer and patterned in a concavo-convex (corrugated) pattern shown in FIG. 13, and photolithograph is carried out thereon. Next, the p-type layer 105, the light-emitting layer 104 and a part of the n-type layer 103 which are the portions not coated with the photo-resist and the SiO$_2$ layer are dry-etched so as to form an area where an electrode for the n-type layer 103 is led out, while the shape of the concavo-convex side surface 109 is formed.

Next, metal (such as Au, Ni or Co) is vapor-deposited to be 1–200 nm thick so as to form the light-transmissive electrode 106 on the p-type layer 105. Then, by vapor deposition, the electrode 108 is formed on the n-type layer 103, and the seat electrode 107 is formed on the light-transmissive electrode 106. The light-emitting diode 100 according to this embodiment is formed thus. As described above, the concavo-convex side surface 109 is formed by using the step for exposing the n-type layer 103. It is therefore unnecessary to provide a new step for forming the concavities and convexities. Thus, the light-emitting element can be obtained easily and at low cost.

Figure 16:
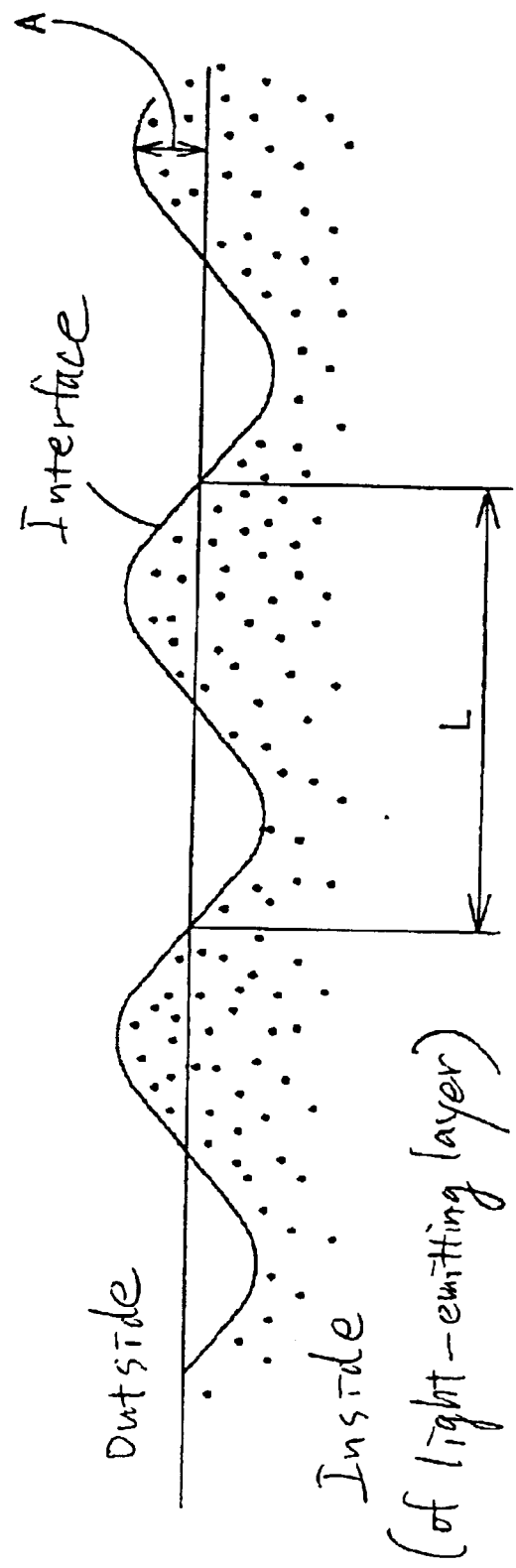
FIG. 16 is a diagram for explaining the optimum shape of a concavo-convex side surface according to the Embodiment 12 of the invention.

Incidentally, it is desired that the shape of the concavo-convex side surface 109 is formed to prevent light emerging from any arbitrary point of the concavo-convex side surface 109, from being blocked by an adjacent convexity thereof. It is considered that if the emergent light is blocked by the adjacent convexity, the light enters the light-emitting layer 104 again, and is confined and attenuated in the light-emitting layer 104. In addition, if the concavo-convex shape is narrow and deep, the substantial external radiation area for the light existing at random does not increase. Accordingly, it is desired that the concavities and convexities are formed under predetermined conditions. For example, the concavo-convex shape of the concavo-convex side surface 109 is formed into a sine wave shape having a periodicity in which the amplitude A is ¼ of the period L (FIG. 16). As a result, the range of the crystal interface in the surface direction is widened, and the area of the crystal interface is increased, so that the light-extracting efficiency is improved. Thus, it is possible to fabricate a light-emitting diode which is higher in light-emitting efficiency than that in the related art. Incidentally, the period is not a temporal period but a period in the sense of a spatial frequency.

Embodiment 13

Although the concavo-convex side surface 109 was formed by use of the step for exposing the n-type layer 103, it may be formed by use of the step of separating the element, which is a final step. This is because a large number of such light-emitting diodes 100 are usually produced on a sapphire substrate 101 by a lithographic technique, and these elements 100 are separated from one another after a series of steps are completed.

Figure 17:
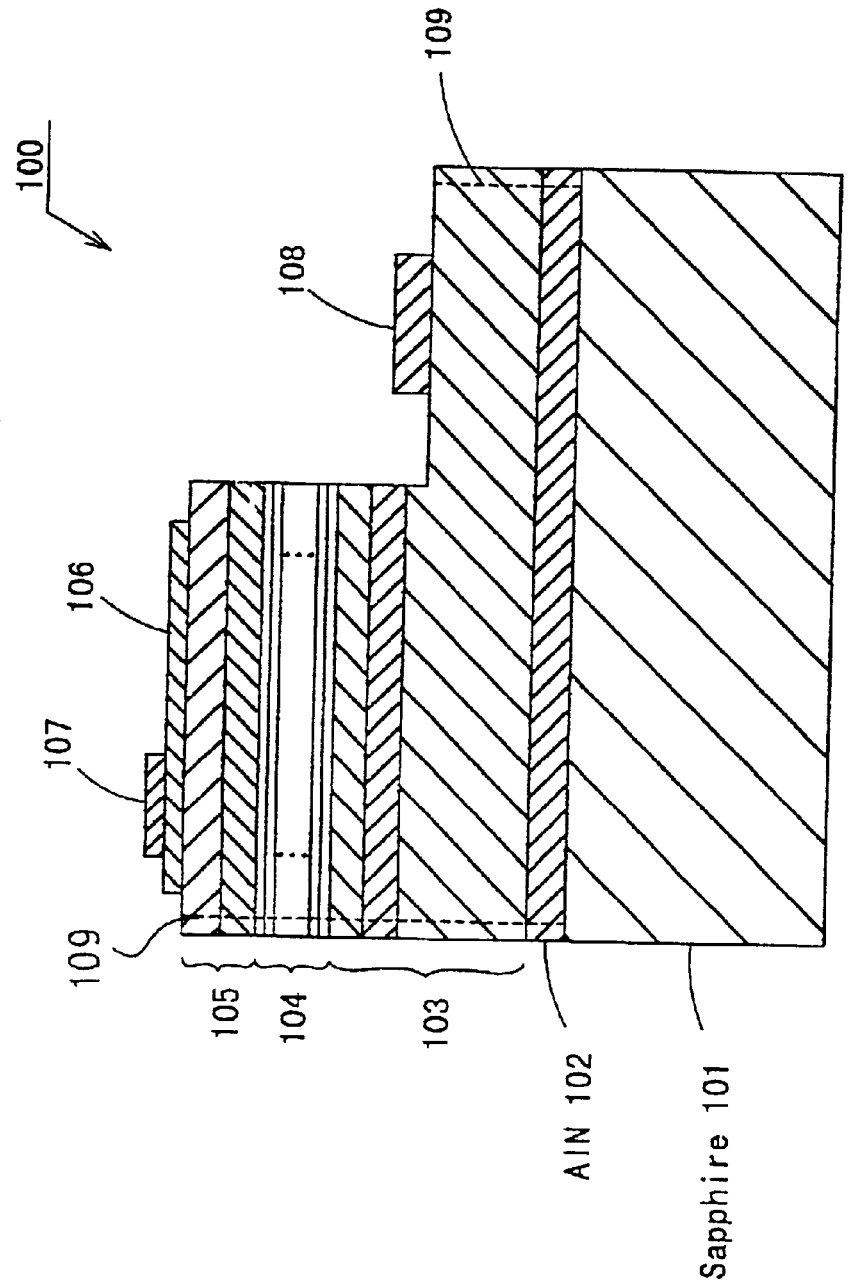
FIG. 17 is a sectional view of the configuration of a light-emitting diode according to Embodiment 13 of the invention.
Figure 18:
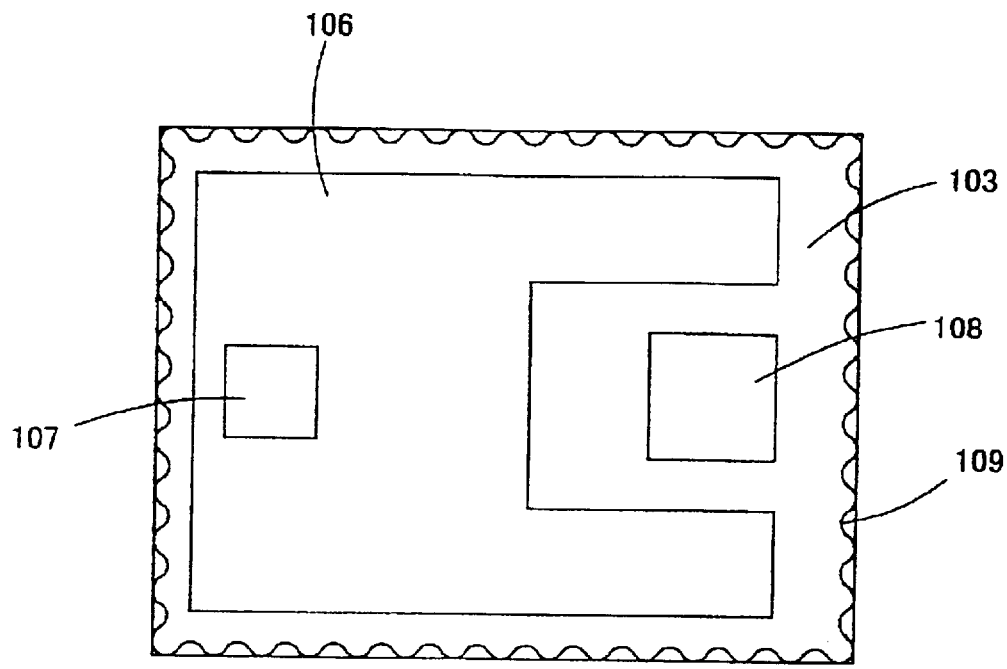
FIG. 18 is a top view of the light-emitting diode according to the Embodiment 13 of the invention.

FIGS. 17 and 18 show an example in which the concavo-convex side surface 109 is formed in the final step of separating the element. FIG. 17 is a sectional view of the configuration, and FIG. 18 is a top view thereof. In FIG. 17, the portion indicated by the broken line is the concavo-convex side surface 109 formed, for example, by etching at the time of separating the element. The concavo-convex side surface 109 may be formed thus. In such a manner, the concavo-convex side surface 109 can be formed to cover all the side surface of the GaN layer so that the light-extracting efficiency can be further improved.

Alternatively, the element may be separated mechanically by a dicing saw. In this case, after the element is separated, the portions other than the side surface is protected with resist or the like, so that only the side surface is etched. Thus, concavities and convexities having various shapes may be formed out of etch pits. In this case, since patterning is not carried out, the side surface is formed into a rough surface by etching. Concavities and convexities are formed similarly in the side surface so that it is possible to obtain a light-emitting diode having higher efficiency than that in the related art.

Embodiment 14

Figure 19:
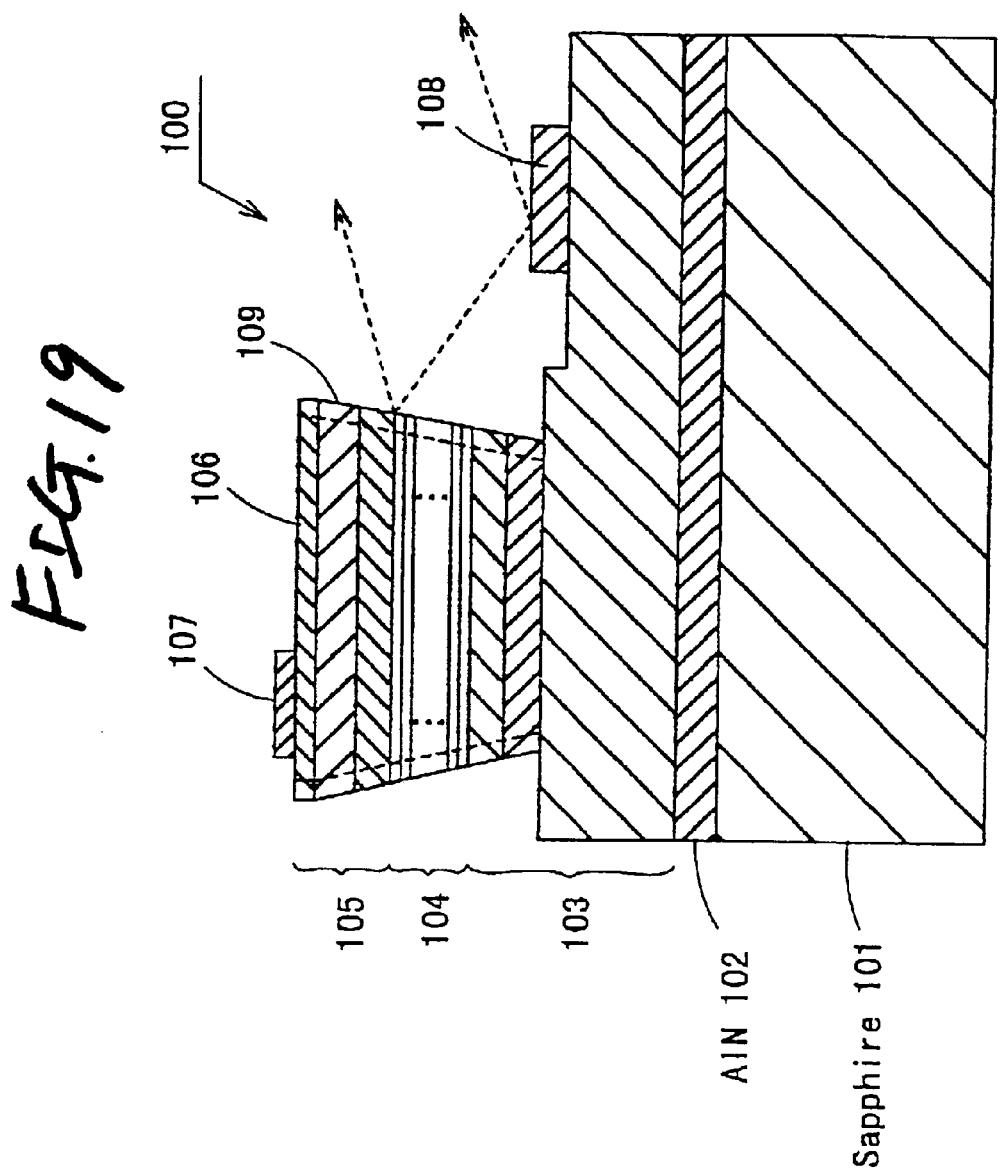
FIG. 19 is a sectional view of the configuration of a light-emitting diode according to Embodiment 14 of the invention.

FIG. 19 shows Embodiment 14 of a light-emitting element. The concavo-convex side surface 109 of the light-emitting diode according to the Embodiment 12 was perpendicular to the sapphire substrate 101. That is, light from the light-emitting layer 104 emerges in parallel with the substrate surface of the sapphire substrate 101. On the other hand, in the Embodiment 14, the concavo-convex side surface 109 is formed to be tapered with respect to the substrate 101. At this time, the light-emitting layer 104 which is a light-emitting area has been laminated on the substrate. Accordingly, the concavo-convex side surface 109 is tapered with respect to the substrate 101. That is, as a result, the area of the crystal interface can be further increased, so that the light-extracting efficiency is increased.

Such a tapered shape is formed while being controlled by the degree of vacuum, the high frequency electric power, the kind of gases, the feed rates of those gases, and so on, in the step of forming the area for the electrode 108 on the n-type layer 103, that is, in the dry etching step of the p-type layer 105, the light-emitting layer 104 and a part of the n-type layer 103.

Incidentally, although the side surface is formed so that the normal line of the side surface has an inverted taper which is a negative angle of elevation with respect to the sapphire substrate 101 in FIG. 19, the side surface may be formed so that the normal line of the side surface has a positive angle of elevation. When each layer is formed by vapor phase epitaxy while the pattern for the layer is reduced gradually, a concavo-convex side surface 109 having a positive taper can be formed. When the concavo-convex side surface is formed in such a manner, the component of emergent light directly traveling toward a portion above the substrate is increased so that the concavo-convex side surface is excellent in visibility. The side surface may be formed thus.

Embodiment 15

Figure 20:
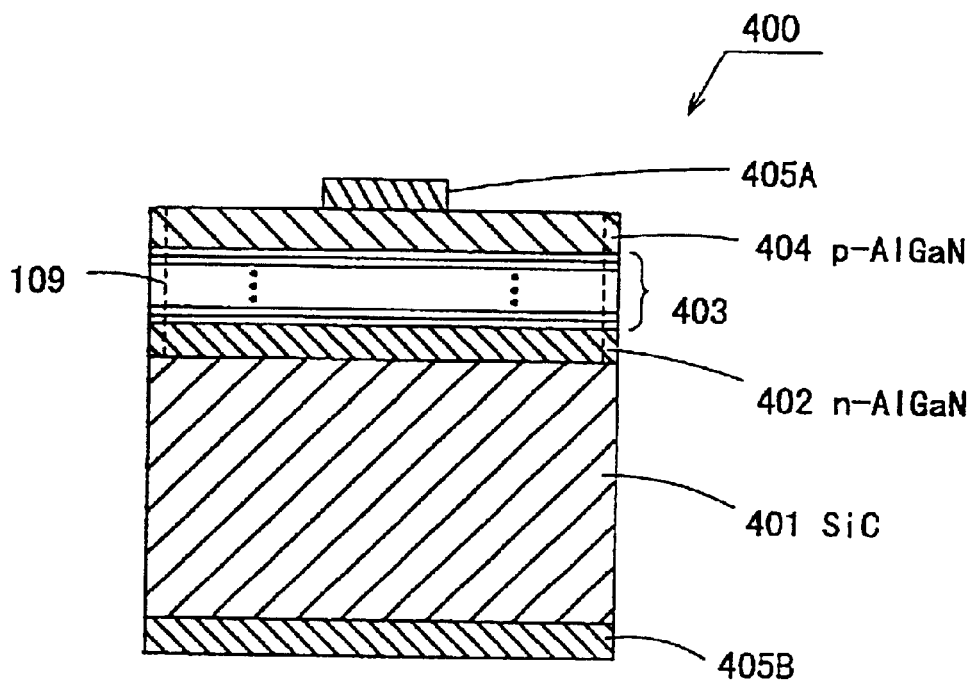
FIG. 20 is a sectional view of the configuration of a light-emitting diode according to Embodiment 15 of the invention.
Figure 21:
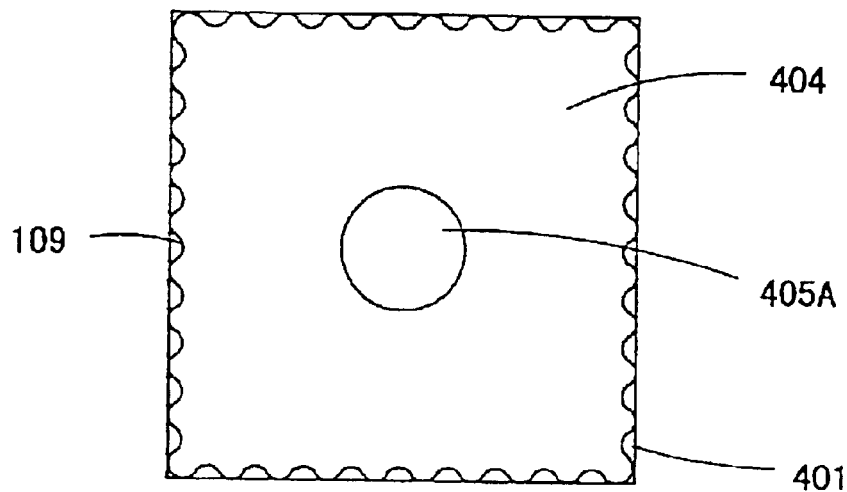
FIG. 21 is a top view of the light-emitting diode according to the Embodiment 15 of the invention.

Each of the Embodiments 12 to 14 has shown examples in which anodes (the light-transmissive electrode 106 and the seat electrode 107) and a cathode (the electrode 108) are provided on the same surface side of the sapphire substrate 101. The invention is not limited to such a mode. For example, a light-emitting element 400 may be formed as shown in FIGS. 20 and 21. FIG. 20 is a sectional view of the configuration thereof and FIG. 21 is a top view thereof.

This light-emitting diode 400 is constituted by an SiC substrate 401 which is a conductive substrate, an n-AlGaN layer 402 which is an n-type layer, a light-emitting layer 403 which is an MQW type, and a p-AlGaN layer 404 which is a p-type layer. In addition, electrodes 405A and 405B are formed on the opposite sides of the light-emitting diode 400. The element configured thus is also produced in an epitaxial growth method (MOVPE) in the same manner as in the Embodiment 12. In this case, a shape whose four sides are formed to be corrugated as shown in FIG. 21 is used for patterning so that each layer is grown with such a pattern. Thus, the light-emitting diode 400 in FIG. 20 is produced easily. Also with such a configuration, light emitted from the light-emitting layer 403 is allowed to emerge efficiently based on the variation of the plane normal line and the increase of the area caused by the side surface formed into the concavo-convex side surface 109. The light-emitting element may be formed thus.

Incidentally, although the embodiment has shown the case where the concavo-convex side surface 109 was made up by MOVPE, the invention is not limited to this. For example, after the element is separated, the portions-other than the side surface are protected with photo-resist so that only the side surface maybe formed into a rough surface by etching or the like. Also in this embodiment, it is possible to obtain a light-emitting diode having higher efficiency than that in the related art.

An SiC (typified by 6H—SiC) substrate, a conductive Si substrate, a conductive GaN substrate, or the like, may be used as the conductive substrate.

Modifications

The invention is not limited to these embodiments, but a wide variety of other modifications can be considered. For example, although a GaN-based semiconductor layer was used for the Group III nitride compound semiconductor element in the above embodiments, not to say, a layer made of $Ga_xIn_{1-x}N$ (e.g. $Ga_{0.08}In_{0.92}N$) or the like, or a layer made of ternary or quaternary AlGaInN having any mixed crystal ratio may be used. More specifically, a ternary Group III nitride compound semiconductor (GaInN, AlInN or AlGaN) or a quaternary Group III nitride compound semiconductor (AlGaInN) expressed by the general formula "$Al_xGa_yIn_{1-x-y}N$ ($0 \leq x \leq 1$, $0 \leq y \leq 1$, and $0 \leq x+y \leq 1$)" can be used. Further, N of those compounds may be partially replaced by a Group V element such as P or As.

For example, in order to form the Group III nitride compound semiconductor layer with good crystallinity when the Group III nitride compound semiconductor is laminated onto the sapphire substrate, it is preferable that a buffer layer is formed to correct the lattice mismatch with the sapphire substrate. It is also preferable that a buffer layer is provided when another substrate is used. As the buffer layer, a Group III nitride compound semiconductor of $Al_xGa_yIn_{1-x-y}N$ ($0 \leq x \leq 1$, $0 \leq y \leq 1$, and $0 \leq x+y \leq 1$) formed at low temperature, more preferably $Al_xGa_{1-x}N$ ($0 \leq x \leq 1$) is used. This buffer layer may be either of a single layer or of multi-layers different in composition or the like. As for the method for forming the buffer layer, the buffer layer may be formed at a low temperature of 380–420° C., or on the contrary, the buffer layer may be formed in a range of 1,000–1,180° C. in an MOCVD method. Alternatively, high purity metal aluminum and nitrogen gas may be used as raw materials to form a buffer layer of AlN in a reactive sputtering method by use of a DC magnetron sputtering apparatus. A buffer layer expressed by the general formula $Al_xGa_yIn_{1-x-y}N$ ($0 \leq x \leq 1$, $0 \leq y \leq 1$, $0 \leq x+y \leq 1$, and at any composition ratio) can be formed in the same manner. Further, a vapor deposition method, an ion plating method, a laser ablation method, or an ECR method can be used. The buffer layer is preferably formed in a physical vapor deposition method at 200–600° C., more preferably at 300–600° C., further preferably at 350–450° C. When the physical vapor deposition method such as the sputtering method is used, the thickness of the buffer layer is preferably 100–3,000 Å. The thickness is more preferably 100–400 Å, most preferably 100–300 Å. Examples of methods for forming the multi-layers include a method in which layers made of $Al_xGa_{1-x}N$ ($0 \leq x \leq 1$) and layers made of GaN are formed alternately; and a method in which layers having the same composition are formed while the forming temperature is alternately changed, for example, between 600° C. or lower and 1,000° C. or lower. Not to say, these methods may be used in combination, and three or more kinds of Group III nitride compound semiconductors of $Al_xGa_yIn_{1-x-y}N$ ($0 \leq x \leq 1$, $0 \leq y \leq 1$, and $0 \leq x+y \leq 1$) may be laminated as the multi-layers. Generally, a buffer layer is amorphous while an intermediate layer is monocrystal. A plurality of periods each constituted by a buffer layer and an intermediate layer may be formed, and the repetition may have any period. The more the repetition is, the better the crystallinity is.

Alternatively, a high-temperature growth buffer layer may be formed on a low-temperature growth buffer layer. In this case, the Group III nitride compound semiconductor as the main body is formed on the high-temperature growth buffer layer.

The invention can be applied substantially to the case where in the buffer layer and the Group III nitride compound semiconductor as a layer above the buffer layer, the composition of Group III elements is partially replaced by boron (B) or thalium (Tl), or the composition of nitrogen (N) is partially replaced by phosphorous (P), arsenic (As), antimony (Sb) or bismuth (Bi). In addition, the compositions of the buffer layer and the Group III nitride compound semiconductor may be doped with an indescribably small amount of those elements. For example, the Group III nitride compound semiconductor of $Al_xGa_{1-x}N$ ($0 \leq x \leq 1$) having no indium (In) or arsenic (As) in its composition may be doped with indium (In) whose atomic radius is larger than aluminum (Al) or gallium (Ga), or with arsenic (As) whose atomic radius is larger than nitrogen (N). Thus, the extensive strain of crystal caused by dropping-out of nitrogen atoms is compensated with the compressive strain so that the crystallinity can be improved. In this case, since acceptor impurities enter the positions of the Group III atoms easily, a p-type crystal can be obtained as grown.

In the case of a basal layer formed out of two or more periods of buffer layers and Group III nitride compound semiconductor layers, each Group III nitride compound semiconductor layer is preferably doped with an element whose atomic radius is larger than any main constituent element. Incidentally, to form a light-emitting element, it is fundamentally desired to use binary or ternary Group III nitride compound semiconductors.

To form an n-type Group III nitride compound semiconductor layer, Group IV or Group VI elements such as Si, Ge, Se, Te or C may be added as n-type impurities. On the other hand, Group II or Group IV elements such as Zn, Mg, Be, Ca, Sr or Ba may be added as p-type impurities. A plurality of these elements or n-type impurities and p-type impurities maybe doped in one and the same layer. The Hall concentration of a GaN-based semiconductor doped with Mg implanted with Be varies from $5.5 \times 10^{16}/cm^3$ to $8.1 \times 10^{19}/cm^3$ by annealing at 1,100° C. for 60 seconds. By implantation with Be, the activation energy of Mg drops down to 170 mV. It is considered that this is because Be releases the connection between Mg and hydrogen and connects with the hydrogen. To obtain a p-type layer, it is therefore desired that together with acceptor impurities such as Mg, Be is implanted therein.

In the configuration of each layer, the dislocation of the Group III nitride compound semiconductor layer maybe reduced desirably by use of lateral epitaxial growth. At this time, a method in which a mask is used or a method in which a step is formed and a lateral growth layer is formed on a recess portion without using any mask can be adopted. As the method using a step, it is possible to adopt a method in which a spot-like or stripe-like recess portion is formed in a substrate, and a gallium-nitride compound semiconductor is grown laterally on the recess portion. Then, a gap may be located between the lateral growth layer and a layer or the substrate under the lateral growth layer. When there is a gap, stress strain is prevented from entering, so that the crystallinity can be further improved. The conditions for the lateral growth include a method of increasing the temperature, a method of increasing the supply rate of Group III element gas, and a method of doping with Mg.

For the p-type layer 105 bonded with the light-transmissive electrode 106, it is desired to use InGaN because high hole concentration can be obtained. When Be and Mg are added to the p-type layer 105, the hole concentration can be made higher. As acceptor impurities, Mg is desired. For example, it is desired that the composition ratio is $In_{0.1}$:$Ga_{0.86}$N. In addition, a superlattice can be used for the p-type layer 105. For example, a superlattice made of p-type AlGaN/p-type GaN can be adopted in order to improve the hole concentration of the layer in which the light-transmissive electrode 106 will be formed, so as to obtain a good ohmic property. Further, if an electric current is sufficiently diffused laterally in the p-type layer 105, the seat electrode 107 may be formed in stead of the light-transmissive electrode 106.

When Group III nitride compound semiconductors are laminated sequentially into layers on a substrate, inorganic crystal substrates of sapphire, silicon (Si), silicon carbide (SiC), spinel ($MgAl_2O_4$), ZnO, MgO or the like, Group III-Group V compound semiconductors such as gallium phosphide or gallium arsenide or Group III nitride compound semiconductors such as gallium nitride (GaN) or the like can be used as the substrate. As the method for forming the Group III nitride compound semiconductor layer, a metal organic vapor phase epitaxy method (MOCVD or MOVPE) is preferable. Alternatively, a molecular beam epitaxy method (MBE), a Halide vapor phase epitaxy method (Halide VPE), a liquid phase epitaxy method (LPE), or the like, may be used. Respective layers may be formed in different epitaxy methods.

In addition, although the sapphire substrate 101 was used as the substrate in the above embodiments, a substrate made of a material described above may be used. Incidentally, for example, when silicon carbide (SiC) is used for the substrate, the refractive index of SiC is equal to that of GaN. Accordingly, there is no light confined only in the GaN layer between the upper and lower interfaces. However, light is radiated omnidirectionally with uniform radiation intensity from lamellar light-emitting points. Thus, the radiant density of light radiated to the side surface of the light-emitting layer is so high that the effect of improvement in extracting light can be obtained by simply forming the concavo-convex side surface 109 having a slight depth. Not to say, the concavo-convex side surface 109 may be deep to reach the substrate. Further, although description has been made on the pn junction type GaN-based light-emitting element in the above embodiments, the light-emitting element may be of an MIS type if it is a solid state light-emitting element having a lamellar light-emitting area. In addition, other materials such as an AlGaAs-based material or a GaAlInP-based material may be used.

In addition, although the concavo-convex side surface 109 was formed to have a sine wave shape in top view in the above embodiments, it may be formed to have a sine wave shape in side view. In such a case, equal effect can be obtained as to the external quantum efficiency. Incidentally, as for the visibility from above, the performance is further improved because the plane normal line has a substrate normal line component (upward component). Further, the shape is not limited to the sine wave shape. The shape may be a triangular ripple shape, a circular-arc shape, or the like. When there are concavities and convexities in the side surface, the external quantum efficiency becomes better than that in the related art regardless of the shape.

In addition, although the side surface of the light-emitting layer was formed into a concavo-convex shape in the above embodiments, concavities and convexities may be added not only to the side surface but also to the top of the light-extracting surface under the light-transmissive electrode 106 by a partial etching method or the like. When light is extracted from both the side surface and the top surface, the light-emitting element is designed so that the external quantum efficiency is further improved.

Dry etching or wet etching is chiefly used for forming the concavities and convexities. Alternatively, a lift-off method may be used. In the lift-off method, resist is patterned into a concavo-convex shape on a substrate, each layer is grown, and after then, this resist is removed. Further, each layer may be formed by use of selective epitaxial growth in which a mask is formed into a concavo-convex shape on a substrate and each layer is grown outside the mask, or by use of epitaxial growth in which each layer is grown while being masked with a mask.

The configuration, shape, quantity, material, size, connection relation, and so on, of the other parts in the light-emitting element are not limited to those described in the respective embodiments.

This invention is not limited to the above description of the mode for carrying out the invention and embodiments thereof at all, and includes various modifications that can be conceived by those skilled in the art without departing from the scope of the claims.

What is claimed is:

1. A light-emitting element comprising:
    a light-emitting layer; and
    at least one light-extracting portion,
        wherein a part of the at least one light-extracting portion is formed into a concave or convex surface for enhancing the efficiency of extracting light from said light-emitting layer.

2. A light-emitting element comprising:
a light-emitting layer; and
at least one light-extracting portion,
  wherein a part of the at least one light-extracting portion is formed into a concave or convex surface for enhancing the efficiency of extracting light, and
  wherein said concave or convex surface of said at least one light-extracting portion is shaped to be substantially convex, and substantially equal refractivity is kept between said light-emitting layer and said at least one light-extracting portion.

3. A light-emitting element according to claim 1, wherein said light-emitting element is mounted so that said light-emitting layer is located on a bottom surface side of said light-emitting element.

4. A light-emitting element according to claim 3, wherein electrodes opposite in polarity are formed on said bottom surface side.

5. A light-emitting element according to claim 2, wherein said substantially convex light-extracting portion includes at least 5 light-extracting surfaces, and said light-emitting layer exists in a direction substantially perpendicular to each of said light-extracting surfaces.

6. A light-emitting element according to claim 2, wherein said substantially convex light-extracting portion includes a curved light-extracting surface, and said light-emitting layer exists in a direction substantially perpendicular to said light-extracting surface.

7. A light-emitting element according to claim 2, wherein said light-emitting layer comprise a part of a crystal layer and is located in a vicinity of a central portion of said substantially convex light-extracting portion.

8. A light-emitting element according to claim 2, wherein said light-emitting element comprises a plurality of said substantially convex light-extracting portions.

9. A light-emitting element according to claim 8, wherein said plurality of substantially convex light-extracting portions are arranged in a lattice structure.

10. A light-emitting element according to claim 7, wherein said light-emitting layer is formed only in a portion of said crystal layer of said light-emitting element, said portion of said crystal layer being substantially perpendicular to said at least one light-extracting portion.

11. A light-emitting element comprising:
a light-emitting layer; and
at least one light-extracting portion,
  wherein a part of the at least one light-extracting portion is formed into a concave or convex surface for enhancing the efficiency of extracting light from said light-emitting layer, and
  wherein said light-extracting portion includes surfaces including a curved surface.

12. A light-emitting element according to claim 11, wherein said curved surface includes a cylindrical surface.

13. A light-emitting element comprising:
a light-emitting layer; and
at least one light-extracting portion,
  wherein a part of the at least one light-extracting portion is formed into a concave or convex surface for enhancing the efficiency of extracting light from said light-emitting layer, and
  wherein at least a circumference of a side surface of said light-emitting layer is wholly or partially formed into a concavo-convex side surface as said concave or convex surface having a concavo-convex shape.

14. A light-emitting element according to claim 13, wherein concavities and convexities of said concavo-convex side surface comprise a curve with a change in curvature.

15. A light-emitting element according to claim 13, wherein said concavo-convex side surface comprise a tapered angle with respect to said light-emitting layer.

16. A light-emitting element according to claim 13, wherein said concavo-convex side surface is formed by etching.

17. A light-emitting element according to claim 13, wherein said concavo-convex side surface is formed by patterning said light-emitting layer.

18. A light-emitting element according to claim 13, wherein said concavo-convex side surface is formed by separating said light-emitting element.

19. A light-emitting element according to claim 13, wherein said light-emitting element is formed on a substrate whose refractive index is smaller than a refractive index of said light-emitting layer.

20. A light-emitting element according to claim 19, wherein each layer of said light-emitting element formed on said substrate comprise a Group III nitride compound semiconductor.

21. A light-emitting element according to claim 13, wherein a top surface of said light-emitting element is also formed into a concavo-convex shape.

22. A light-emitting element comprising:
a light-emitting layer; and
a concave or convex surface for internally reflecting light-emitted from said light-emitting layer toward one or more other surfaces of said light-emitting element for enhancing the efficiency of extracting light form said light-emitting layer.

23. A light-emitting element according to claim 22, wherein selected ones of reflecting grooves and reflecting holes as said concave or convex surface are formed in a bottom surface of said light-emitting element, and wherein light emitted from said light-emitting layer is reflected upward by said selected ones of said reflecting grooves and said reflecting holes.

24. A light-emitting element according to claim 23, wherein said light-emitting layer is formed on said bottom surface side.

25. A light-emitting element according to claim 23, wherein electrodes opposite in polarity are formed on said bottom surface side.

26. A light-emitting element according to claim 23, wherein maximum heights of said selected ones of said reflecting grooves and said reflecting holes reach in an internal portion of said light-emitting layer.

27. A light-emitting element according to claim 23, wherein a light-emitting area of said light-emitting layer is formed as split light-emitting areas formed in places other than places where said selected ones of said reflecting grooves and said reflecting holes are formed.

28. A light-emitting element according to claim 23, wherein a substrate lower in refractive index than said light-emitting layer is located above said light-emitting layer.

29. A light-emitting element comprising:
a light-emitting layer; and
at least one light-extracting portion, wherein
  a part of the at least one light-extracting portion comprises a concave or convex surface, and
  said concave or convex surface and said light-emitting layer have a substantially equal refractivity.

* * * * *